(12) United States Patent  
Owada et al.

(10) Patent No.: US 8,916,423 B2  
(45) Date of Patent: Dec. 23, 2014

(54) SEMICONDUCTOR DEVICE AND METHOD OF MANUFACTURING THE SAME

(71) Applicant: Fujitsu Semiconductor Limited, Kanagawa (JP)

(72) Inventors: Tamotsu Owada, Yokohama (JP); Hikaru Ohira, Kuwana (JP); Hirosato Ochimizu, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/791,069

(22) Filed: Mar. 8, 2013

(65) Prior Publication Data

US 2013/0320508 A1    Dec. 5, 2013

(30) Foreign Application Priority Data

May 29, 2012    (JP) ................. 2012-122047

(51) Int. Cl.
*H01L 21/82* (2006.01)
*H01L 21/02* (2006.01)
(Continued)

(52) U.S. Cl.
CPC ...... *H01L 21/02107* (2013.01); *H01L 29/0603* (2013.01); *H01L 21/02118* (2013.01); *H01L 21/02282* (2013.01); *H01L 21/02318* (2013.01); *H01L 21/02348* (2013.01); *H01L 21/02351* (2013.01); *H01L 21/304* (2013.01); *H01L 25/0657* (2013.01); *H01L 21/76898* (2013.01); *H01L 21/76801* (2013.01); *H01L 2224/16145* (2013.01); *H01L 2224/16225* (2013.01);
(Continued)

(58) Field of Classification Search
USPC ............ 438/127, 958; 257/E21.502, E23.116
See application file for complete search history.

(56) References Cited

U.S. PATENT DOCUMENTS 6,319,851 B1    11/2001    Mihara et al.
2008/0265441 A1    10/2008    Okada et al.

FOREIGN PATENT DOCUMENTS

JP    2005-174990 A    6/2005
JP    2007-311385 A    11/2007
(Continued)

OTHER PUBLICATIONS

Korean Office Action dated Feb. 18, 2014, issued in Korean Patent Application No. 10-2013-0040927, w/English translation, (6 pages).

*Primary Examiner* — Amar Movva
(74) *Attorney, Agent, or Firm* — Westerman, Hattori, Daniels & Adrian, LLP

(57) ABSTRACT

A method of manufacturing a semiconductor device includes: forming a first electrode on a first semiconductor substrate; coating the semiconductor substrate with an insulating material having a first viscosity at a first temperature, having a second viscosity lower than the first viscosity at a second temperature higher than the first temperature, and having a third viscosity higher than the second viscosity at a third temperature higher than the second temperature; and forming a first insulating film by curing the insulating material. In this method, the forming the first insulating film includes: bringing the insulating material to the second viscosity by heating the insulating material under a first condition; and bringing the insulating material to the third viscosity by heating the insulating material under a second condition. The first condition and the second condition are different in their temperature rising rate.

9 Claims, 24 Drawing Sheets

(51) Int. Cl.
*H01L 29/06* (2006.01)
*H01L 21/304* (2006.01)
*H01L 25/065* (2006.01)
*H01L 21/768* (2006.01)
*H01L 23/532* (2006.01)

(52) U.S. Cl.
CPC ............... *H01L 2224/32145* (2013.01); *H01L 2224/32225* (2013.01); *H01L 2224/73204* (2013.01); *H01L 2224/92125* (2013.01); *H01L 2924/15311* (2013.01); *H01L 23/5329* (2013.01); *Y10S 438/958* (2013.01)
USPC ............ 438/127; 257/E21.502; 257/E23.116; 438/958

(56) References Cited

FOREIGN PATENT DOCUMENTS

| JP | 2008-294405 A | 12/2008 |
| KR | 2000-0057892 A | 9/2000 |

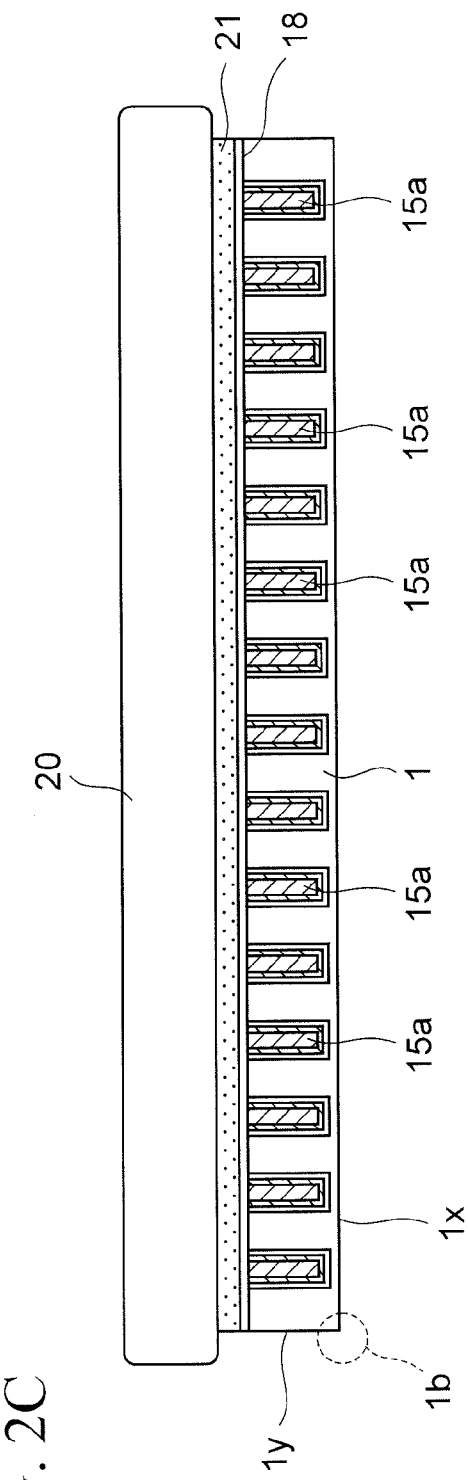

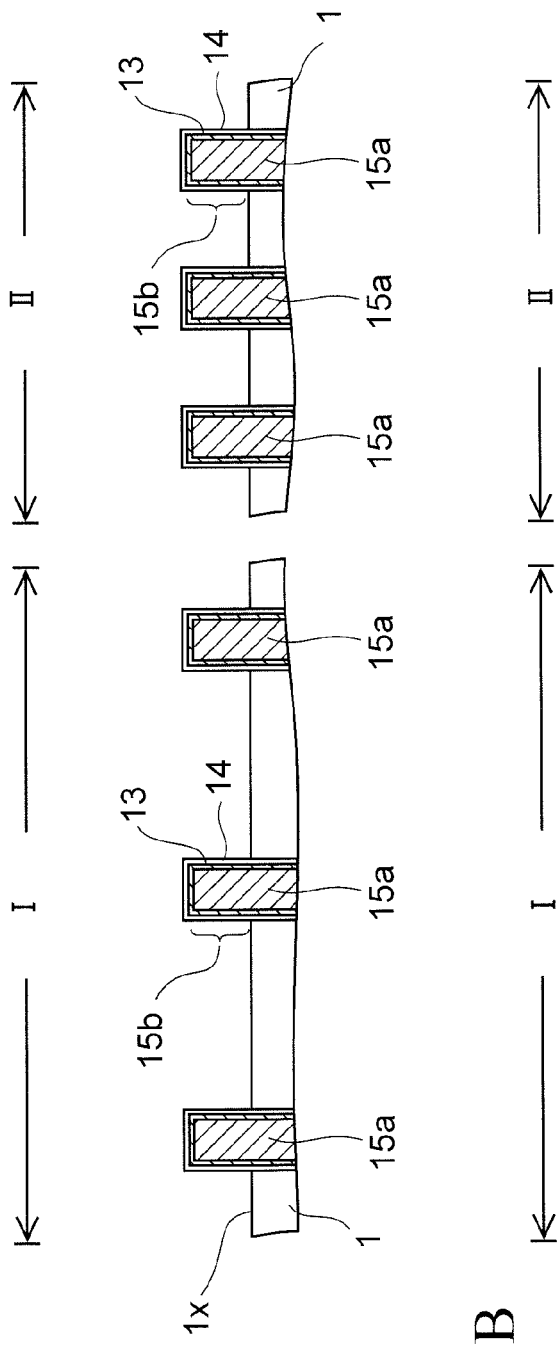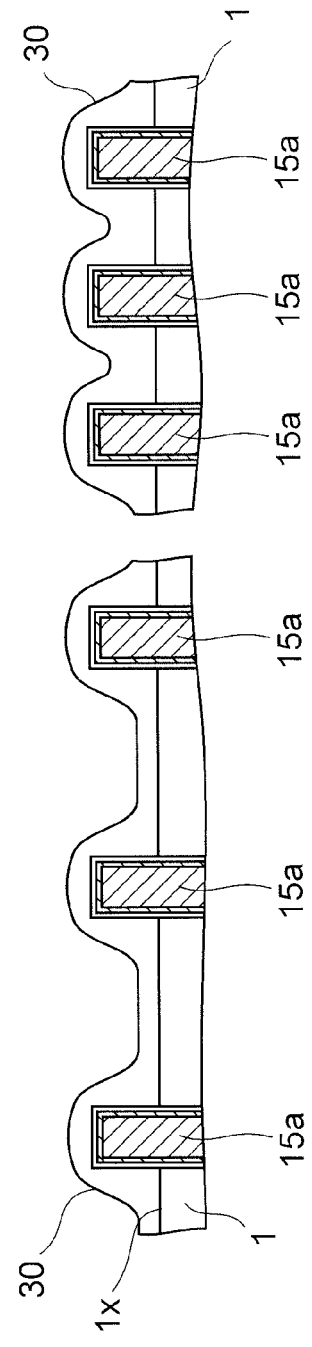

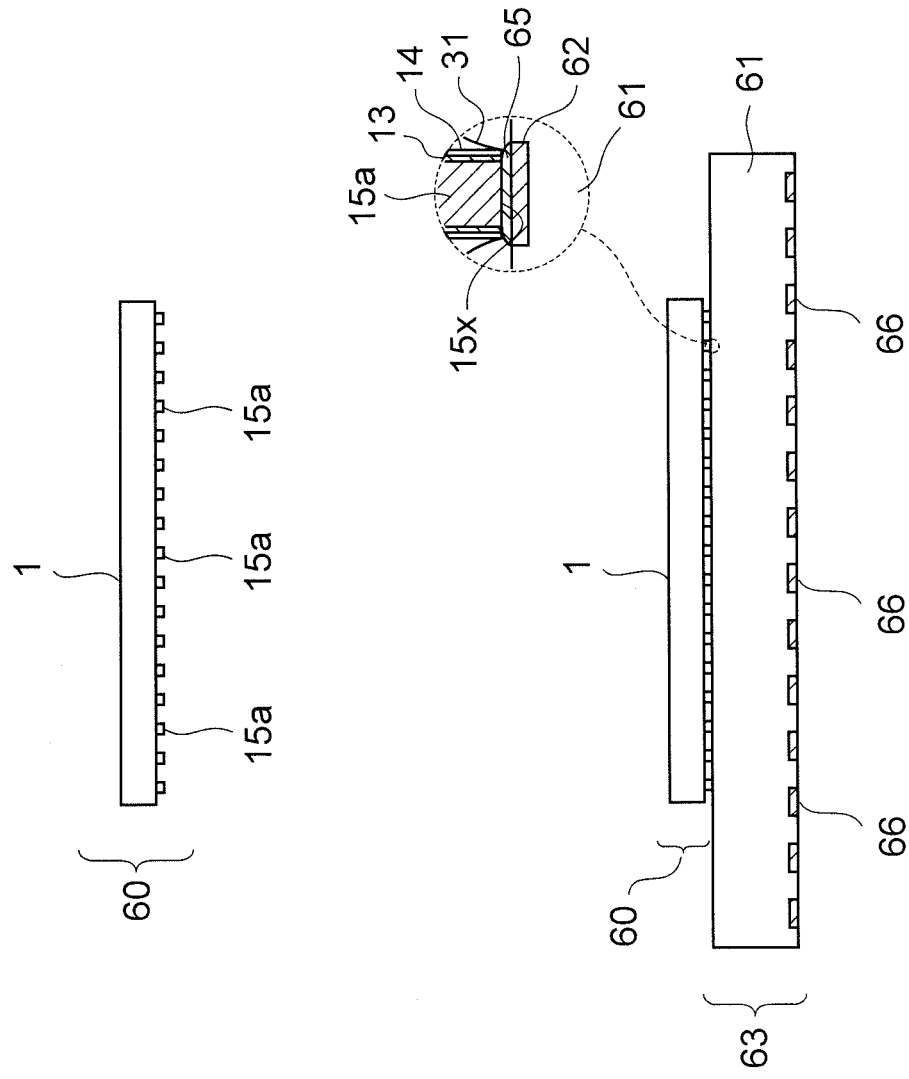

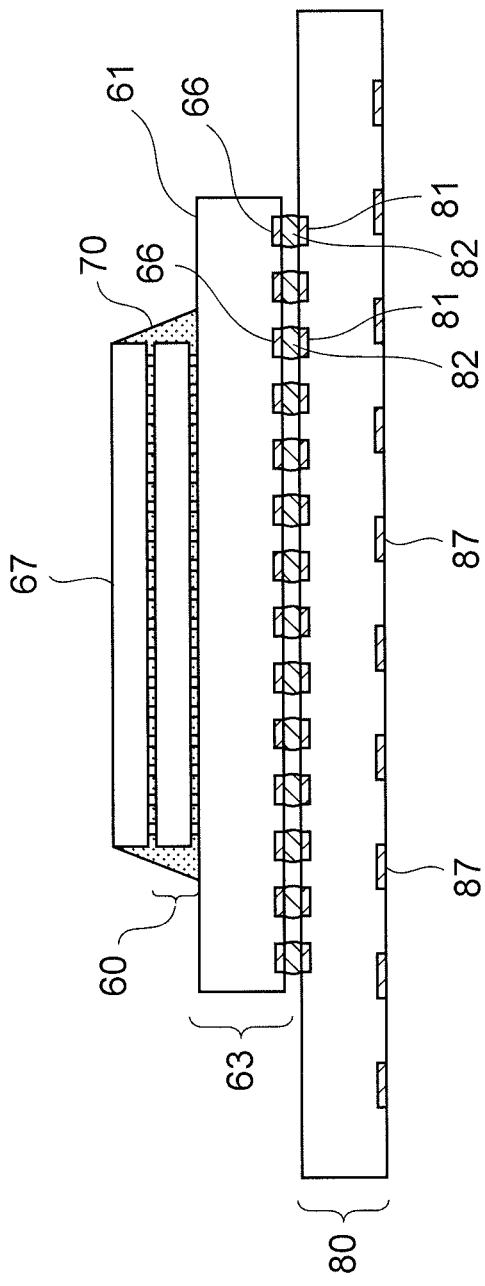
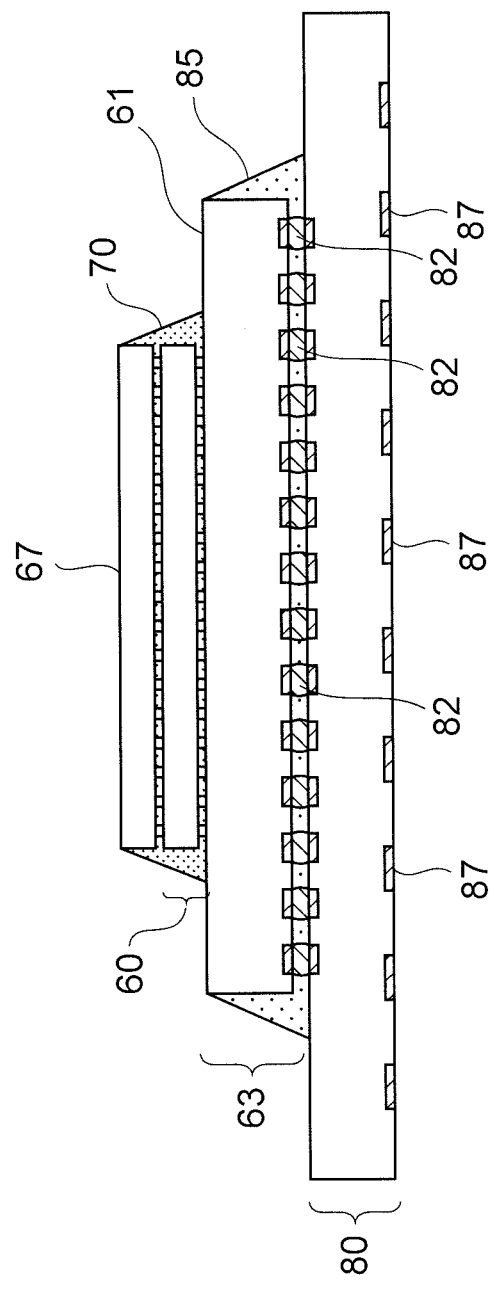
FIG. 4F
FIG. 4G

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-122047, filed on May 29, 2012, the entire contents of which are incorporated herein by reference.

FIELD

The embodiments discussed herein are related to a semiconductor device and a method of manufacturing the same.

BACKGROUND

Semiconductor devices, such as LSIs, are manufactured by performing various kinds of processes, such as film formation and etching, on a semiconductor substrate. If the surface of the semiconductor substrate is left exposed to the air after completion of these steps, elements such as transistors formed on the semiconductor substrate may be deteriorated by the moisture and the like contained in the air.

To prevent such element deterioration, the steps for manufacturing the semiconductor devices include a step of forming an insulating film to protect the semiconductor substrate from the air. This insulating film is called a passivation film. The step of forming the passivation film is preferably as simple as possible in order to reduce the costs of the semiconductor devices.

[Patent Document 1] Japanese Laid-open Patent Publication No. 2005-174990
[Patent Document 2] Japanese Laid-open Patent Publication No. 2007-311385
[Patent Document 3] Japanese Laid-open Patent Publication No. 2008-294405

SUMMARY

According to an aspect of the following disclosure, there is provided a method of manufacturing a semiconductor device, the method including: forming a first electrode on a first semiconductor substrate, the first electrode including a first portion protruding from a main surface of the first semiconductor substrate; coating the main surface and the first electrode with an insulating material having a first viscosity at a first temperature, having a second viscosity lower than the first viscosity at a second temperature higher than the first temperature, and having a third viscosity higher than the second viscosity at a third temperature higher than the second temperature; and forming a first insulating film by curing the insulating material. The forming the first insulating film includes: after the coating, bringing the insulating material having the first viscosity to the second viscosity by heating the insulating material under a first condition; and after the bringing the insulating material to the second viscosity, bringing the insulating material to the third viscosity by heating the insulating material under a second condition. Here, as the first condition, a temperature rising rate for the first semiconductor substrate different from a temperature rising rate of the second condition is used.

According to another aspect of the disclosure, there is provided a semiconductor device including: a first semiconductor substrate; a first electrode including a first portion protruding from a main surface of the first semiconductor substrate; and a first insulating film formed on a side surface of the first portion and on the main surface, the longer a distance from the first portion is, the thinner a thickness of the first insulating film is in a portion of the first insulating film on the main surface.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A to 2H are overall sectional views of the semiconductor device, in the course of manufacturing thereof, used for the research;

FIGS. 3A to 3D are enlarged sectional views of a semiconductor device in the course of manufacturing thereof according to a first embodiment;

FIGS. 4A to 4H are overall sectional views of the semiconductor device in the course of manufacturing thereof according to the first embodiment;

DESCRIPTION OF EMBODIMENTS

Before describing embodiments, a description is given of the result of research made by the inventors of the present application.

Among various types of semiconductor devices in which a passivation film is formed, a semiconductor device including electrodes called TSVs (Through Silicon Vias) is used as an example in the following description. The TSVs are useful in stacking a plurality of semiconductor elements.

FIGS. 1A to 1H are enlarged sectional views illustrating a semiconductor device, in the course of manufacturing thereof, used for the research by the inventors of the present application.

Figure 1A:
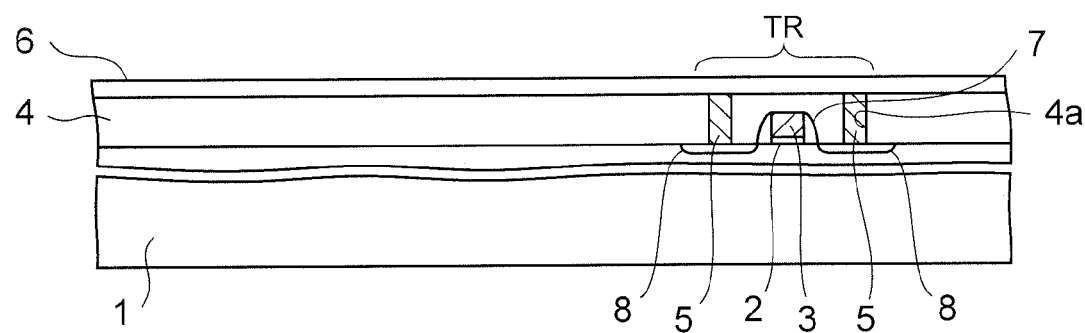
FIGS. 1A to 1H are enlarged sectional views of a semiconductor device, in the course of manufacturing thereof, used for a research.

First, a description is given of steps performed to obtain the sectional structure illustrated in FIG. 1A.

First of all, a gate insulating film 2 and a gate electrode 3 of a MOS transistor TR are formed in this order on a first semiconductor substrate 1. Then, as a sidewall insulating film 7, a silicon oxide film is formed on the sides of the gate electrode 3 by the CVD process.

Note that examples of the first semiconductor substrate 1 include a silicon substrate and the like.

Then, with the gate electrode 3 and the sidewall insulating film 7 used as a mask, n-type source and drain regions 8 are formed in the first semiconductor substrate 1 by injecting an n-type impurity thereinto.

Next, as a first interlayer insulating film 4, a silicon oxide film about 100 nm to 1000 nm thick is formed on the first semiconductor substrate 1 and the gate electrode 3 by the CVD process. After that, the first interlayer insulating film 4 is patterned to form contact holes 4a on the n-type source and drain regions 8.

Next, contact plugs 5 made of tungsten are formed in the contact holes 4a. Then, as a first film 6, a silicon carbide (SiC) film about 5 nm to 100 nm thick is formed on the contact plugs 5 and the first interlayer insulating film 4 by the CVD process.

Figure 1B:
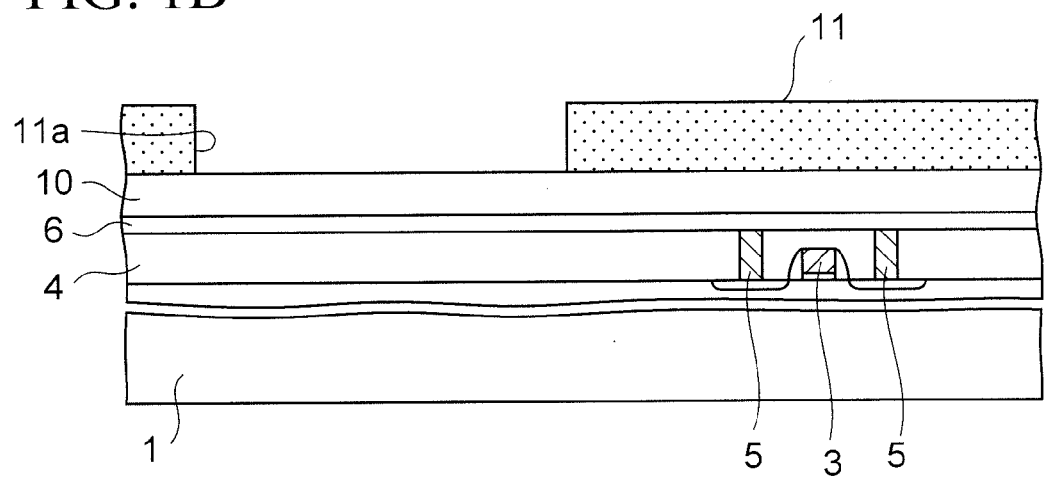

Subsequently, as illustrated in FIG. 1B, as a second film 10, a silicon oxide film about 5 nm to 500 nm thick is formed on the first film 6 by the CVD process.

Thereafter, a resist film 11 having an opening 11a is formed on the second film 10.

Figure 1C:
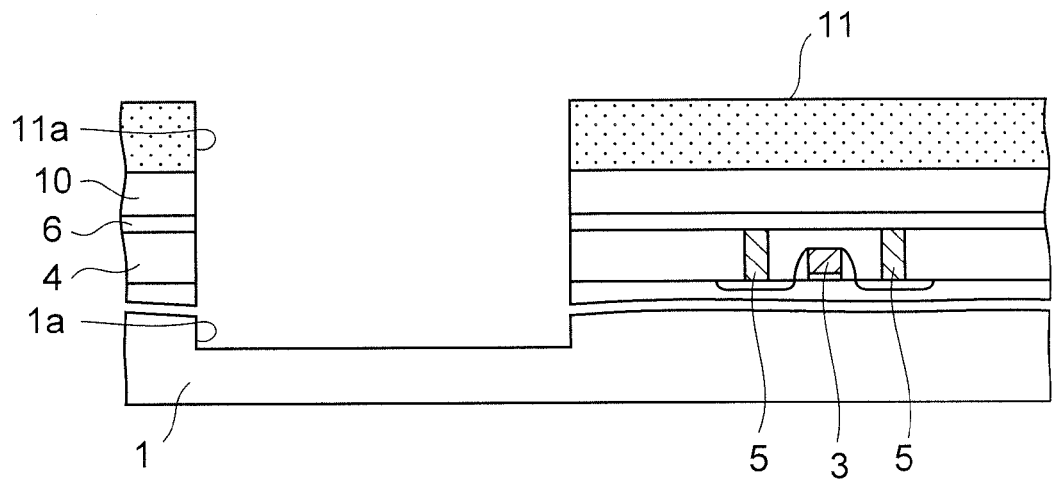

Next, as illustrated in FIG. 1C, the second film 10 to an intermediate portion of the first semiconductor substrate 1 are dry-etched through the opening 11a by the RIE (Reactive Ion Etching) process to form a dent portion 1a in the first semiconductor substrate 1. The etching gas used for the dry etching is not particularly limited. In the embodiments, the dry etching is performed using the Bosch process which, for example, alternately supplies $SF_6$ and $C_4F_8$.

In this dry etching, the second film 10 is used as a hard mask.

The resist film 11 is removed after the dry etching.

Figure 1D:
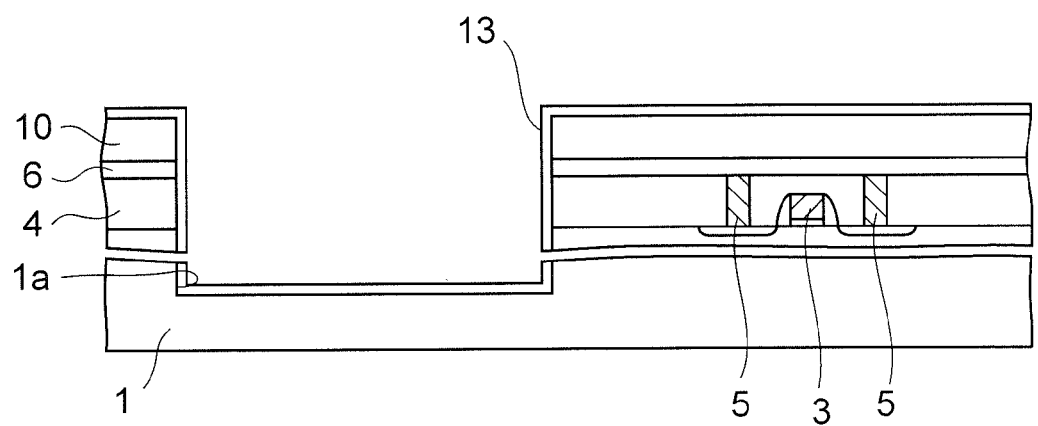

Next, as illustrated in FIG. 1D, a silicon oxide film is formed as a liner insulating film 13 on an inner surface of the dent portion 1a and on the second film 10 by the CVD process which uses a TEOS (Tetraethyl orthosilicate) gas. The thickness of the liner insulating film 13 on the side surface of the dent portion 1a is about 50 nm to 500 nm.

Figure 1E:
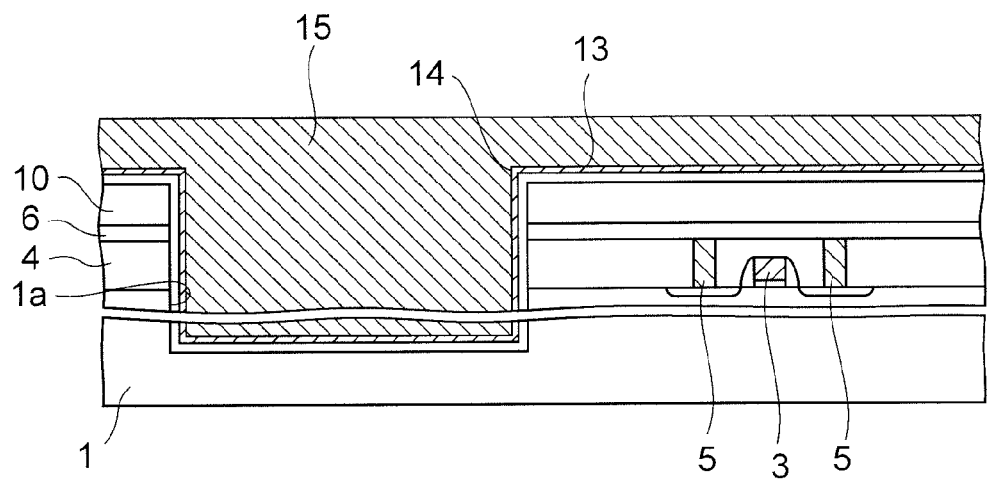

Further, as illustrated in FIG. 1E, a barrier metal film 14 is formed on the liner insulating film 13. The barrier metal film 14 plays a role of preventing copper in a copper plating film to be formed thereon from diffusing into the first semiconductor substrate 1. In this example, a tantalum film, a titanium film, a tantalum nitride film, or a titanium nitride film is formed as the barrier metal film 14 by the sputtering method.

Then, as a seed layer, a copper film (not illustrated) is formed on the barrier metal film 14 by the sputtering method, and by supplying electricity through the seed layer, a copper plating film is formed on the barrier metal film 14 as a conductive film 15. This conductive film 15 completely fills in the dent portion 1a.

Figure 1F:
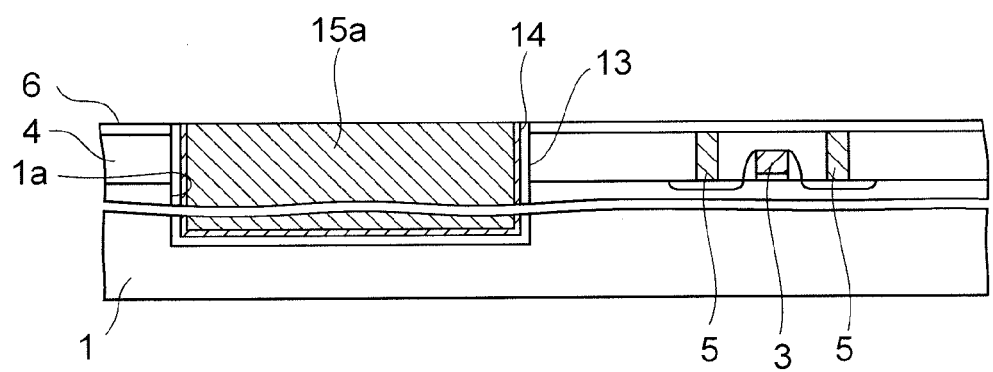

Thereafter, as illustrated in FIG. 1F, excessive portions of the conductive film 15 and the barrier metal films 14 above the first film 6 are removed by being polished by the CMP (Chemical Mechanical Polishing) process. As a result, the conductive film 15 remains in the dent portion 1a as a first electrode 15a. In this step, since the polishing speed for the first film 6 is lower than that for the second film 10, the polishing may easily be stopped before the first film 6.

The first electrode 15a is electrically insulated from the first semiconductor substrate 1 by the liner insulating film 13 on the side surface of the dent portion 1a.

Although the diameter of the first electrode 15a is not particularly limited, the diameter is set to about 1 μm to 100 μm in the embodiments.

Figure 1G:
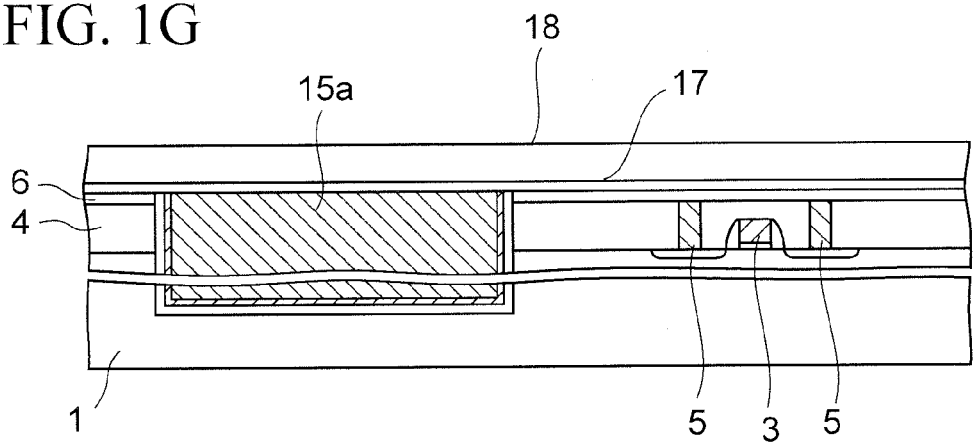

Next, as illustrated in FIG. 1G, a silicon carbide film about 5 nm to 100 nm thick is formed as a third film 17 on the first electrode 15a and the first film 6 by the CVD process.

Further, a second interlayer insulating film 18 is formed on the third film 17 by the CVD process. As the second interlayer insulating film 18, a low-dielectric film having a lower dielectric constant than a silicon oxide film is preferably formed in order to achieve higher device speed. In the embodiments, a SiOC film 20 nm to 500 nm thick is formed as the low-dielectric film by the CVD process.

Figure 1H:
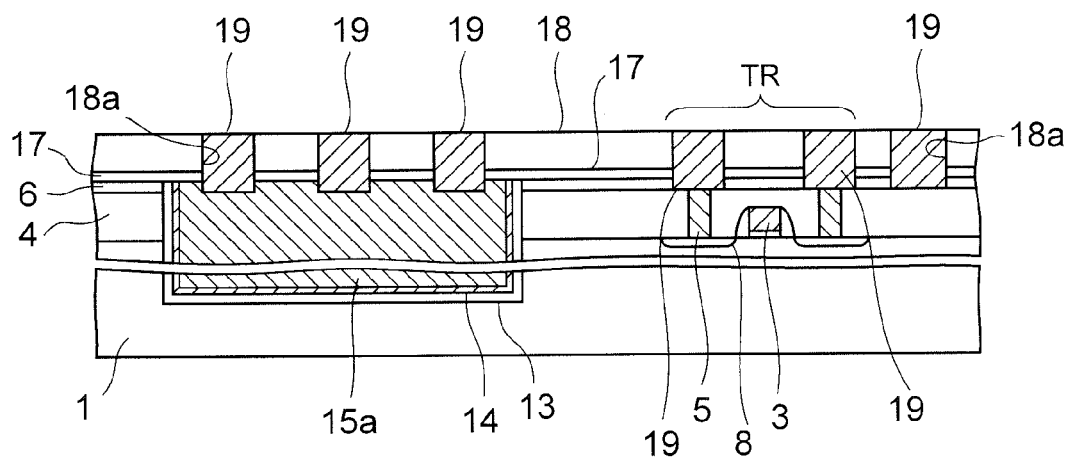

Next, as illustrated in FIG. 1H, the first film 6, the third film 17, and the second interlayer insulating film 18 are dry-etched by the RIE process to form wiring grooves 18a in these films. For example, a $CF_4$ gas or the like is used as the etching gas in this RIE process.

Then, a copper plating film is formed as copper wiring 19 in each of the wiring grooves 18a using the electrolytic plating process.

By the steps thus far, a structure in which the first electrode 15a and the transistor TR are electrically connected to each other via the copper wiring 19 is obtained.

After this, the manufacturing steps proceed to a step of protruding the first electrode 15a from the back surface of the first semiconductor substrate 1.

This step is described with reference to FIGS. 2A to 2H. FIGS. 2A to 2H are overall sectional views of the semiconductor device used for the research by the inventors of the present application.

Note that elements in FIGS. 2A to 2H which are the same as those described in FIGS. 1A to 1H are denoted by the same reference numerals as those in FIGS. 1A to 1H, and are not described again below.

Figure 2A:
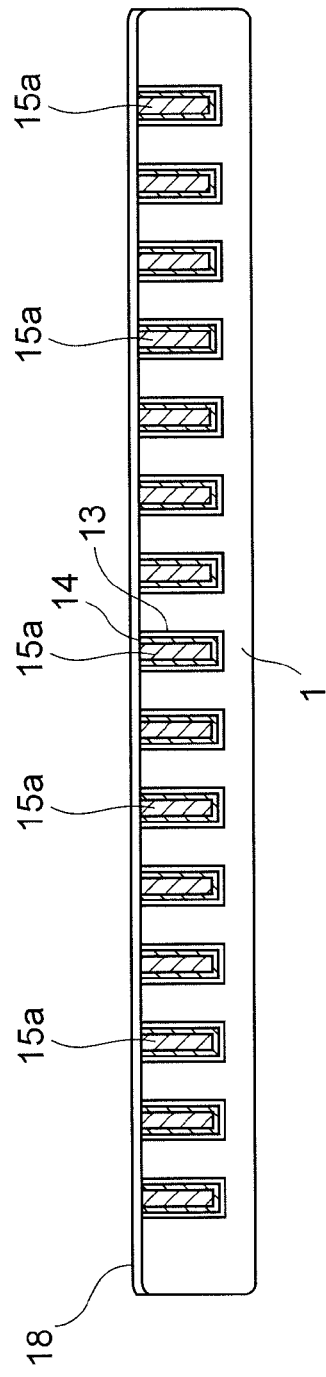

FIG. 2A is an overall sectional view of the first semiconductor substrate 1 at the end of the above-described step in FIG. 1H. Note that FIG. 2A does not illustrate the copper wiring 19 (see FIG. 1H) to prevent complication of the drawing.

As illustrated in FIG. 2A, in this state, a plurality of first electrodes 15a are embedded in the first semiconductor substrate 1.

Figure 2B:
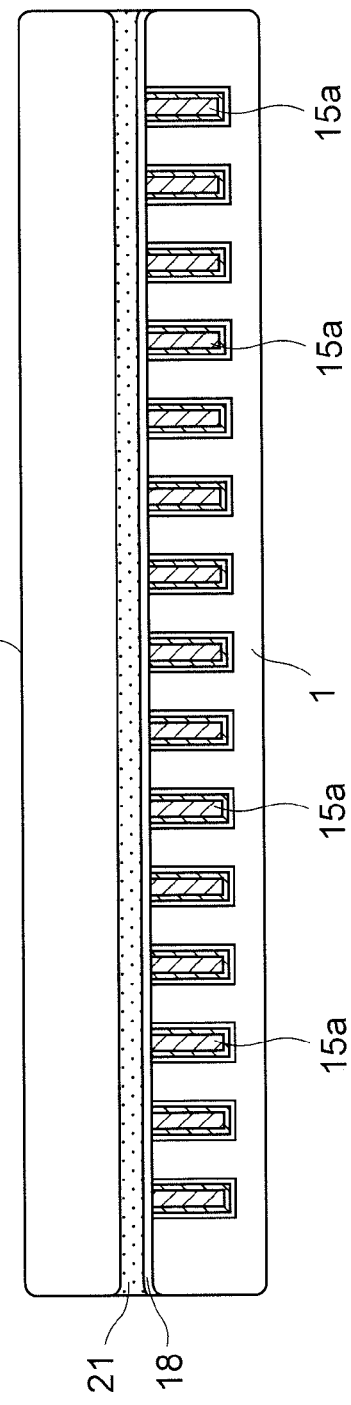

Next, as illustrated in FIG. 2B, a support substrate 20 is attached to the first semiconductor substrate 1 with an adhesive 21 interposed therebetween.

The support substrate 20 is, for example, a glass substrate, and is used to prevent the first semiconductor substrate 1 from warping in the following steps.

Subsequently, as illustrated in FIG. 2C, the side surfaces 1y of the first semiconductor substrate 1 are trimmed away using a dicing saw so that each side surface 1y and a main surface 1x of the first semiconductor substrate 1 forms a right angle at a corner portion 1b.

Thereafter, the first semiconductor substrate 1 is ground from the main surface 1x side so as to be reduced in thickness.

This grinding is sometimes called back grinding. By this grinding, the first semiconductor substrate 1 is reduced to a thickness of about 20 μm to 200 μm.

Since the corner portion 1b of the first semiconductor substrate 1 is brought to a right angle before the back grinding, the corner portion 1b is still at a right angle after the back grinding. Thereby, the corner portion 1b is prevented from becoming an acute angle, which is easily chipped, by the back grinding.

Next, as illustrated in FIG. 2D, the support substrate 20 is flipped upside down. Then, the main surface 1x of the first semiconductor substrate 1 is dry-etched by the RIE process so that each first electrode 15a protrudes in a columnar shape from the main surface 1x.

The portion of the first electrode 15a protruding from the main surface 1x serves as a protrusion portion 15b, and the height of the protrusion portion 15b measured from the main surface 1x is about 1 µm to 20 µm. Such an electrode penetrating the semiconductor substrate 1 and protruding from the main surface 1x thereof is called a TSV.

Although the etching gas used in this dry etching is not particularly limited, a mixture of a $CF_4$ gas and an oxygen gas is used as the etching gas in the embodiments.

Since the liner insulating film 13 and the barrier metal film 14 has an etching resistance to this etching gas, the liner insulating film 13 and the barrier metal film 14 are not etched and remain on the protrusion portion 15b at the end of this step.

Instead of the dry etching, wet etching may be used to etch the main surface 1x.

When the first semiconductor substrate 1 is reduced in thickness as above, a thin semiconductor device may be obtained, but on the other hand, the transistor TR (see FIG. 1A) and the like may be deteriorated by moisture and the like entering the first semiconductor substrate 1 through the main surface 1x.

Figure 2E:
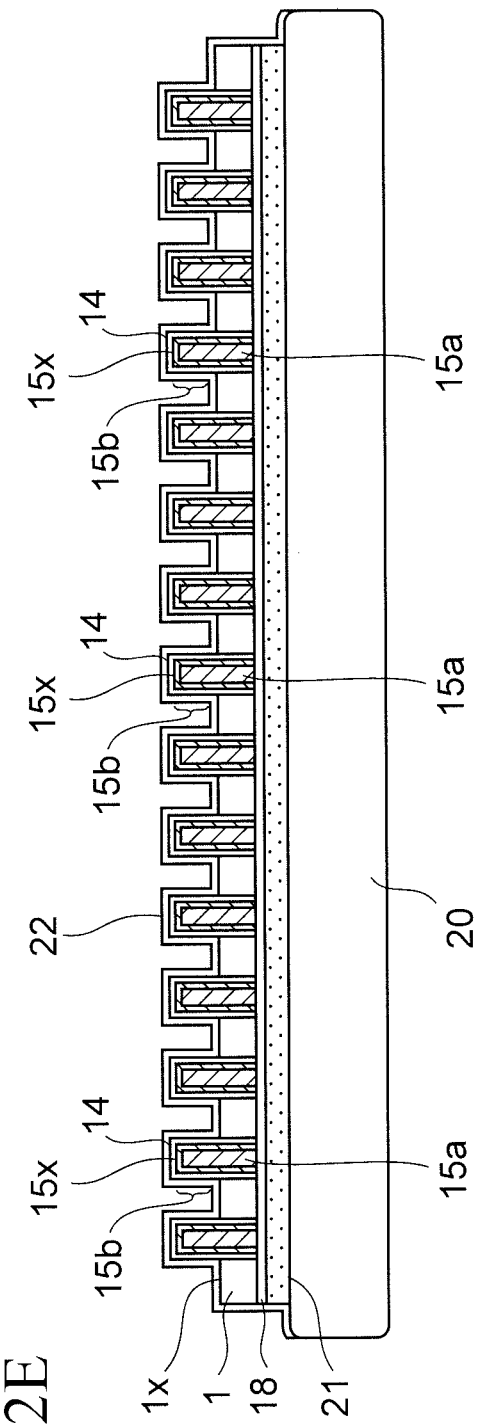

Accordingly, in the next step, a silicon oxide film about 10 nm to 2000 nm thick is formed as a passivation film 22 on the main surface 1x and the protrusion portions 15b by the CVD process, as illustrated in FIG. 2E. This passivation film 22 covering the main surface 1x of the first semiconductor substrate 1 may prevent moisture and the like from entering the first semiconductor substrate 1.

In the CVD process, the passivation film 22 is formed also on the protrusion portions 15b. However, since upper surfaces 15x of the protrusion portions 15b are later to be electrically connected to other semiconductor elements or a circuit substrate, the passivation film 22 at portions above the upper surfaces 15x is preferably removed.

A possible way to remove the passivation film 22 above the upper surfaces 15x is to etch back the passivation film 22. However, in this way, the passivation film 22 on the main surface 1x of the first semiconductor substrate 1 is etched as well.

Especially, the passivation film 22 formed by the CVD process has a low step coverage, and therefore the passivation film 22 formed on the main surface 1x and that formed on the upper surface 15x are substantially equal in thickness. Accordingly, when the passivation film 22 is removed from the upper surface 15x by etching, the passivation film 22 is also removed from the main surface 1x. As a result, the first semiconductor substrate 1 is not protected by the passivation film 22.

Figure 2F:
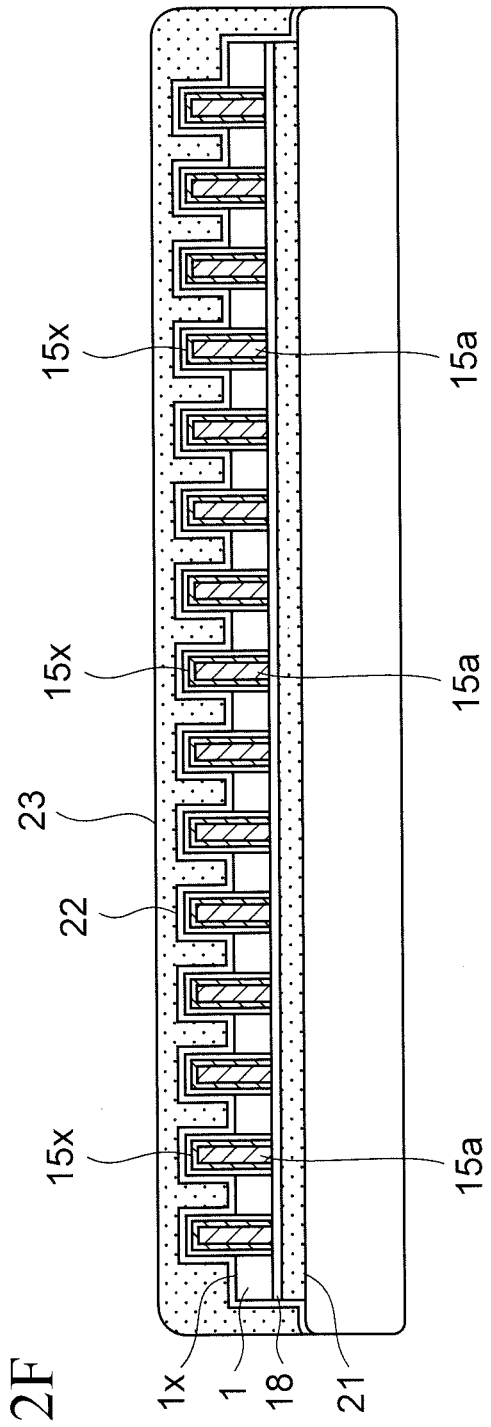

For this reason, in the next step, for example, a resist film is formed as an etching sacrificial film 23 on the passivation film 22, as illustrated in FIG. 2F.

Figure 2G:
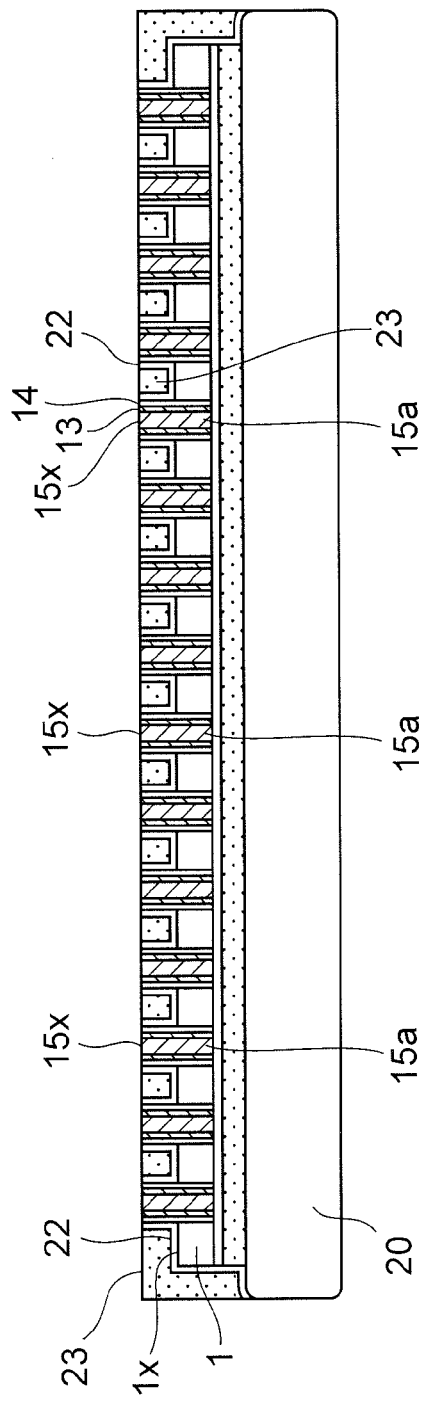

Then as illustrated in FIG. 2G, the liner insulating film 13, the barrier metal film 14, the passivation film 22, and the sacrificial film 23 are dry-etched, removing these films from the upper surfaces 15x of the first electrodes 15a to expose the upper surfaces 15x.

In this step, the sacrificial film 23 on the main surface 1x of the first semiconductor substrate 1 prevents the passivation film 22 on the main surface 1x from being exposed to the etching atmosphere, and therefore allows the passivation film 22 to remain on the main surface 1x.

Figure 2H:
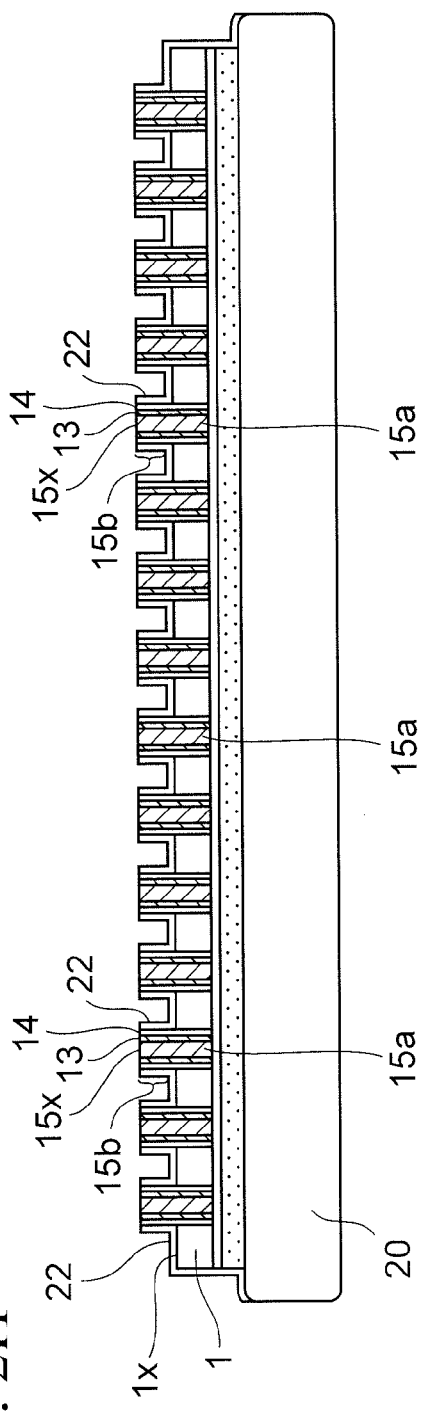

Then, as illustrated in FIG. 2H, the resist film formed as the sacrificial film 23 is removed through ashing.

Thereafter, the first semiconductor substrate 1 is peeled off the support substrate 20, and then the first semiconductor substrate 1 is diced into individual semiconductor elements. This is not described in detail here.

As described above, in this example, the sacrificial film 23 is formed on the first semiconductor substrate 1 before exposing the upper surfaces 15x of the first electrodes 15a by etching.

This sacrificial film 23 plays a role of preventing the passivation film 22 from being removed from above the main surface 1x of the first semiconductor substrate 1 by etching. However, the steps of manufacturing the semiconductor devices become complicated because they include the steps of forming and removing the sacrificial film 23.

Moreover, the passivation film 22 not only protects the first semiconductor substrate 1, but also reinforces the strength of the columnar protrusion portions 15b. However, the passivation film 22 formed by the CVD process has a high Young's modulus and is therefore mechanically fragile.

Thus, when a mechanical impact is externally applied to the protrusion portions 15b, the passivation film 22 may be cracked at portions around the protrusion portions 15b, which might make the passivation film 22 no longer able to sufficiently reinforce the protrusion portions 15b, and also might lower the moisture prevention ability of the passivation film 22.

Embodiments are described below.

First Embodiment

FIGS. 3A to 3D are enlarged sectional views of a semiconductor device in the course of manufacturing thereof according to this embodiment. Note that elements in FIGS. 3A to 3D which are the same as those described in FIGS. 1A to 1H and 2A to 2H are denoted by the same reference numerals as those in FIGS. 1A to 1H and 2A to 2H, and are not described again below.

First, through the above-described steps in FIGS. 1A to 1H and 2A to 2D, a structure illustrated in FIG. 3A is obtained. Specifically, the protrusion portions 15b of the first electrodes 15a protrude from the main surface 1x of the first semiconductor substrate 1.

In this embodiment, in the first semiconductor substrate 1, the first electrodes 15a are sparsely located in a first area I and densely located in a second area II compared to those formed in the first area I. The interval between the adjacent first electrodes 15a is about 100 µm in the first area I, and is about 50 µm in the second area II.

Note that the density of the first electrodes 15a is not limited to such, and the first electrodes 15a may be formed at equal intervals in the entire area of the first semiconductor substrate 1.

Next, as illustrated in FIG. 3B, the main surface 1x of the first semiconductor substrate 1 and the first electrodes 15a are coated with an insulating material to form a coating film 30.

The insulating material is not particularly limited, but in order for the coating film 30 to be curable later, a preferable material is one with an insulation component which is caused to undergo a cross-linking reaction by any of heating, ultraviolet irradiation, microwave irradiation, and electron-beam irradiation, to increase its viscosity.

Examples of such an insulating material include divinylsiloxane bisbenzocyclobutene, a benzocyclobutene polymer, polyimide, fluorinated polyimide, hydrogen silsesquioxane, polysilsesquioxane, polymethylsilsesquioxane, an amorphous fluorinated polymer, organosiloxane, and an epoxy resin.

Among these insulating materials, a benzocyclobutene polymer containing mesitylene as a solvent is used to form the coating film 30 in this embodiment. The boiling point of mesitylene is, for example, about 165° C.

Figure 5:
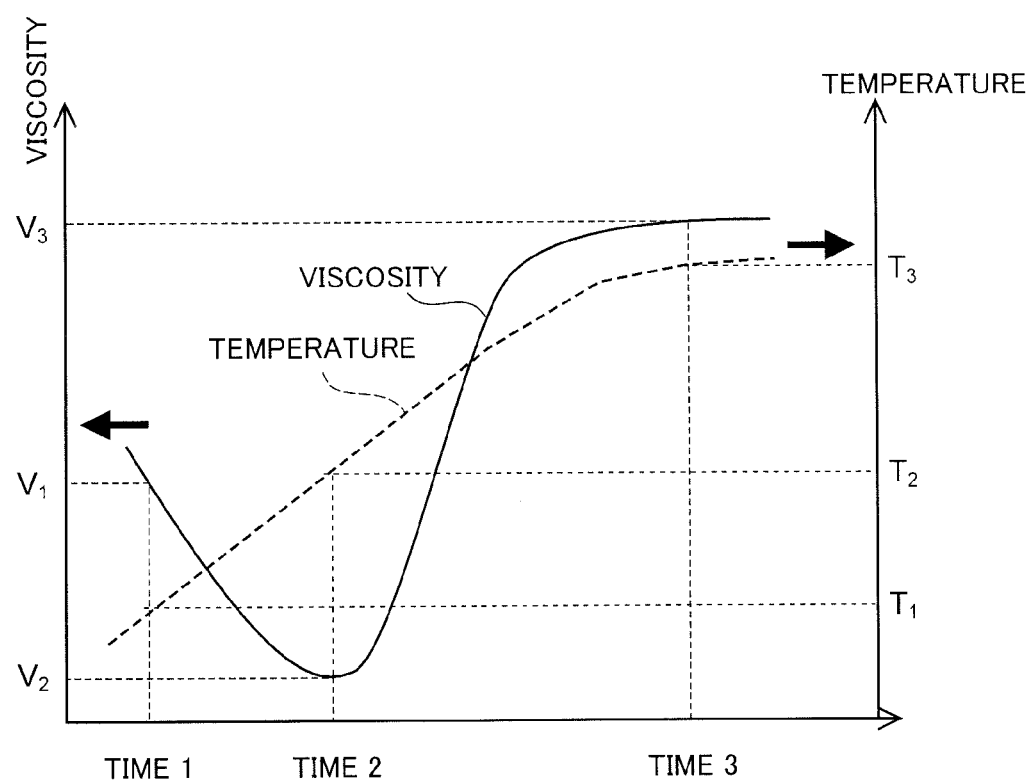
FIG. 5 is a graph illustrating the relation between the viscosity and temperature of a coating film over time, in the process of heating and curing the coating film according to the embodiments.

FIG. 5 is a graph indicating the relation between the viscosity and the temperature of the coating film 30 over time in the process of heating and curing the coating film 30.

As illustrated in FIG. 5, at Time 1, the coating film 30 has a first temperature $T_1$ and a first viscosity $V_1$. By being kept heated, at Time 2, the coating film 30 reaches a second temperature $T_2$ (150° C. to 250° C.) which is higher than the first temperature $T_1$, and reaches a second viscosity $V_2$ which is lower than the first viscosity $V_1$. By being further heated, at Time 3, the coating film 30 reaches a third temperature $T_3$ (250° C. to 400° C.) which is higher than the second temperature $T_2$, and reaches a third viscosity $V_3$ which is higher than the second viscosity $V_2$ since the insulating material in the coating film 30 is caused to undergo a cross-linking reaction.

The reason why the viscosity of the coating film 30 decreases at the second temperature $T_2$ is because, for example, movement of monomer molecules is activated due to the increase in the temperature.

Figure 3C:
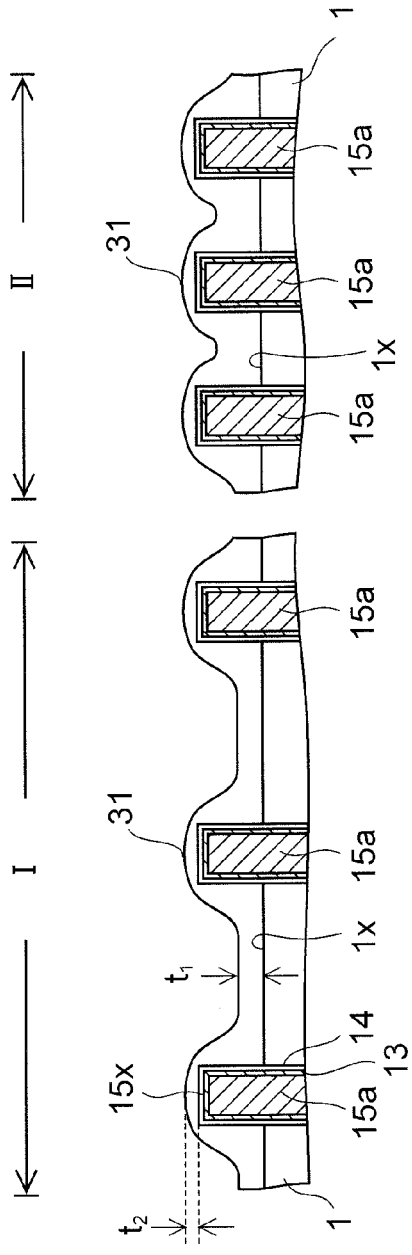

Next, the coating film 30 is heated to cross-link its insulation component and is thereby thermally cured to form the passivation film 31 as illustrated in FIG. 3C.

Figure 6:
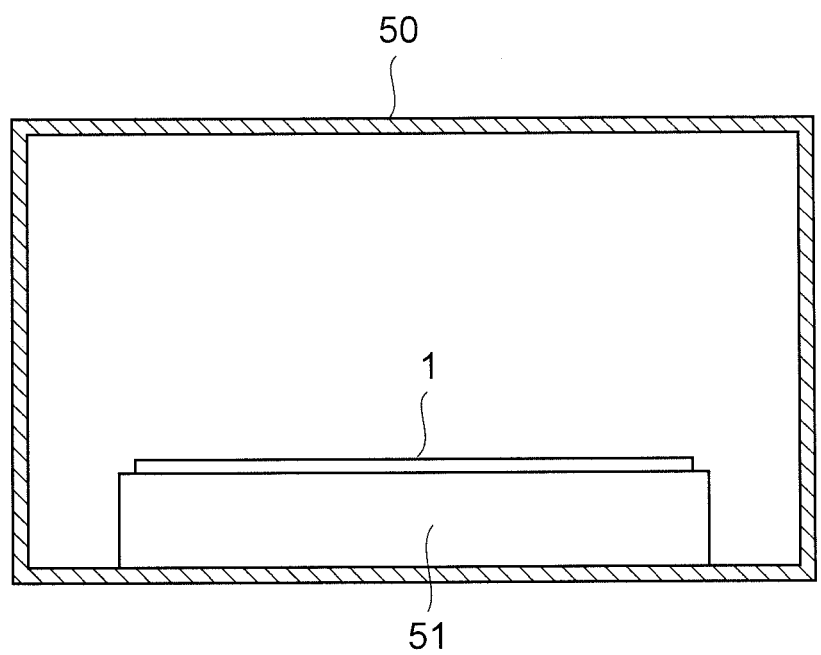
FIG. 6 is a sectional view of a heating chamber used in the first embodiment.

FIG. 6 is a sectional view of a heating chamber 50 used in this step.

As illustrated in FIG. 6, the heating chamber 50 includes therein a heating plate 51 having a heater (not illustrated) inside, and the first semiconductor substrate 1 is placed on the heating plate 51.

Although the atmosphere inside the heating chamber 50 is not particularly limited, in order to prevent oxidization of the coating film 30 during the heating, the inside of the heating chamber 50 is preferably an inert atmosphere, such as a nitrogen atmosphere or a noble-gas atmosphere, in which oxygen is excluded.

The heating chamber 50 may be depressurized, and in this embodiment, the coating film 30 is thermally cured under a nitrogen atmosphere depressurized to about 1 mm Torr to 500 Torr in the heating chamber 50.

Figure 7:
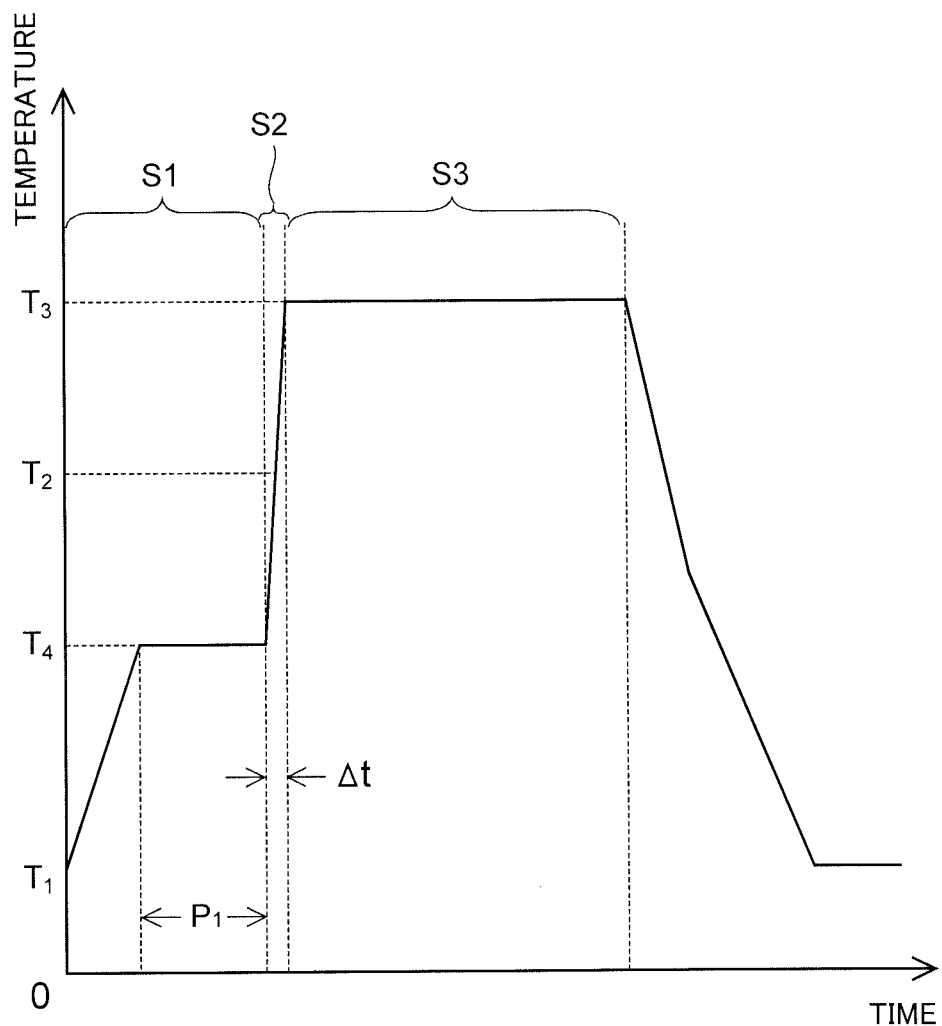
FIG. 7 indicates the temperature profile of a heating plate used in the first embodiment.

FIG. 7 illustrates the temperature profile of the heating plate 51 in this step. In FIG. 7, the horizontal axis indicates a heating time period, and the vertical axis indicates the temperature of the heating plate 51.

Although the temperature of the heating plate 51 is referred to below, the temperature of the first semiconductor substrate 1 may be referred to instead.

As illustrated in FIG. 7, the coating film 30 is thermally cured through Steps S1 to S3.

First, in Step S1, the coating film 30 having the first viscosity $V_1$ at the first temperature $T_1$ (see FIG. 5) is heated so that the first semiconductor substrate 1 may be maintained at a fourth temperature $T_4$ for a first period $P_1$. Thereby, the solvent contained in the coating film 30 is removed.

The fourth temperature $T_4$ is not particularly limited. However, when the coating film 30 becomes too high in temperature, the viscosity of the coating film 30 decreases to the second viscosity $V_2$, as illustrated in FIG. 5. If this state continues for a long period of time, the surface tension of the coating film 30 causes the coating film 30 in the first area I having the sparsely-located first electrodes 15a to transfer to the second area II having the densely-located first electrodes 15a, making the coating film 30 in the first area I not thick enough.

Accordingly, the fourth temperature $T_4$ may be as low as possible, preferably equal to the boiling point (165° C. or lower) of the solvent in the coating film 30, for example. More preferably, the fourth temperature $T_4$ is set lower than the second temperature $T_2$ at which the coating film 30 is brought to the second viscosity $V_2$. In view of these points, the fourth temperature $T_4$ is set to 100° C. to 150° C. in this embodiment.

Further, the period $P_1$ for which the first semiconductor substrate 1 is maintained at the fourth temperature $T_4$ is preferably set to, for example, about 50 seconds to 100 seconds, which is enough for the solvent contained in the coating film 30 to evaporate sufficiently.

To make the solvent evaporate fast, this step may be performed in a depressurized atmosphere.

Next, in Step S2, the temperature of the heating plate 51 is rapidly increased to increase the temperature of the coating film 30 to the third temperature $T_3$. In the process of this temperature increase, the coating film 30 reaches the second temperature $T_2$ at which the viscosity of the coating film 30 is brought to the low second viscosity $V_2$, as already described.

As a result, the coating film 30 runs from the upper surfaces 15x of the first electrodes 15a to the main surface 1x, so that a thickness $t_2$ of the passivation film 31 on the upper surfaces 15x may be made smaller than a thickness $t_1$ of the passivation film 31 on the main surface 1x.

However, if this state where the coating film 30 has a low viscosity continues for a long time, the surface tension of the coating film 30 causes the coating film 30 to transfer from the first area I having the sparsely-located first electrodes 15a to the second area II having the densely-located first electrodes 15a, making the coating film 30 in the first area I not thick enough.

Accordingly, the time period for which the coating film 30 has the second viscosity $V_2$ is preferably shortened by using a temperature rising rate which is as high as possible, as a heating condition in Step S2. In this embodiment, a time period $\Delta t$ in which the coating film 30 increases from the fourth temperature $T_4$ to the third temperature $T_3$ is set to a short time period which is about 60 seconds to 150 seconds, and the temperature rising rate for the coating film 30 is set to 1° C./sec to 3° C./sec. Thus, the coating film 30 is prevented from becoming not thick enough in the first area I.

The larger the amount of solvent contained in the coating film 30, the easier the coating film 30 flows on the main surface 1x so that the decrease in thickness of the coating film 30 is more clear in the first area I. However, since the solvent in the coating film 30 is removed in advance in Step S1 in this embodiment, the thickness inadequacy of the coating film 30 is prevented.

Then, in Step S3, the heating plate 51 is maintained at the third temperature $T_3$ for, for example, about 5 minutes to 60 minutes. Thereby, the coating film 30 is brought to the third viscosity $V_3$. Through these steps, the coating film 30 is cured to form the passivation film 31. Note that the passivation film 31 is an example of the first insulating film.

Step S3 does not use the high temperature rising rate used in Step S2, and a temperature rising rate lower than that used in Step S2 is adequate. In this embodiment, the coating film 30 is maintained at a constant temperature by making the temperature rising rate in Step S3 0° C./sec, for example. However, as long as the insulating material in the coating film 30 may be caused to undergo a cross-linking reaction, some increase or decrease in the temperature is allowed.

Figure 3D:
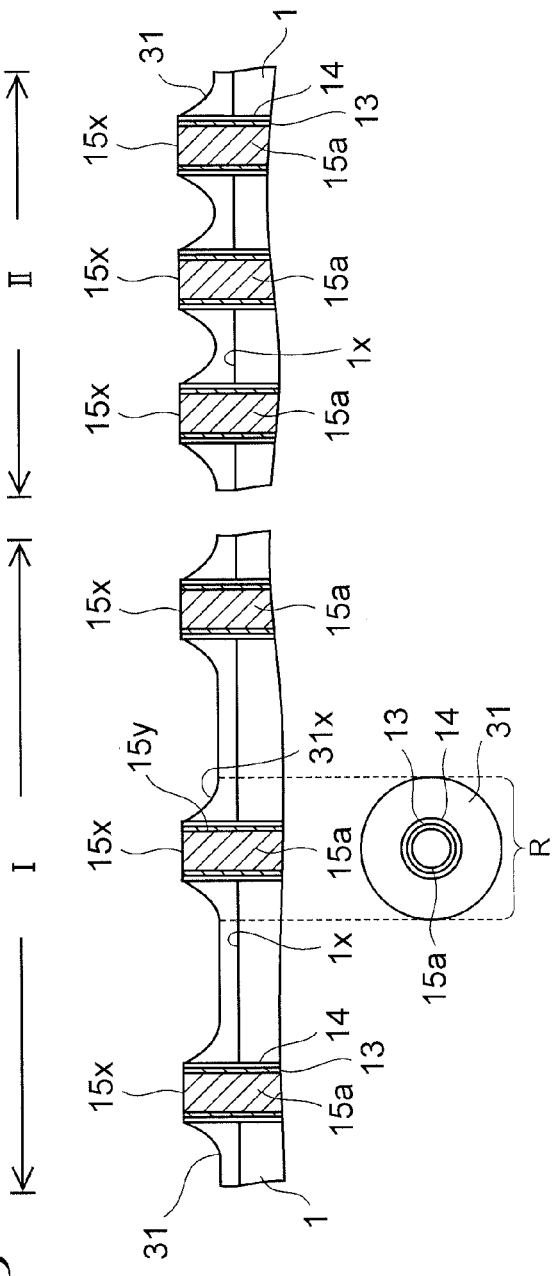

Next, as illustrated in FIG. 3D, by the RIE process, the passivation film 31 is etched back, and the liner insulating film 13 and the barrier metal film 14 on the upper surfaces 15x of the first electrodes 15a are etched and removed to expose the upper surfaces 15x.

The etching gas used in this RIE process is not particularly limited. In this embodiment, a mixture of a $CF_4$ gas and an oxygen gas is used to perform the RIE process.

As described earlier, the thickness $t_2$ of the passivation film 31 on the upper surfaces 15x is smaller than the thickness $t_1$ of the passivation film 31 on the main surface 1x. For this reason, by setting the etching amount in this step based on the thickness $t_2$, the passivation film 31 on the upper surfaces 15x may be selectively removed, while the passivation film 31 remains on the main surface 1x.

As a result, it may be unnecessary to form the sacrificial film 23 (see FIG. 2F) for the purpose of preventing the passivation film 31 on the main surface 1x from being etched. Since the steps for the formation and removal of the sacrificial film 23 may be omitted, the steps for manufacturing the semiconductor devises may be simplified.

By using the difference between the thicknesses $t_1$ and $t_2$ of the passivation film 31 as above, the passivation film 31 may be removed from the upper surfaces 15x of the first electrodes 15a, while being left on the main surface 1x, as illustrated in FIG. 3D.

The passivation film 31 remaining around the protrusion portions 15b also plays a role of reinforcing the mechanical strength of the protrusion portions 15b.

Especially, the passivation film 31 formed by the coating method has a lower Young's modulus and higher flexibility than that formed by the CVD process. Accordingly, even when a mechanical impact is applied to the protrusion portions 15b during mounting or the like, the passivation film 31 is unlikely to be cracked. Consequently, the protrusion portions 15b may be sufficiently reinforced by the passivation film 31, so that the risk of lowering the moisture prevention ability of the passivation film 31 due to a crack may be prevented.

In the passivation film 31 formed by the coating method as described above, at each portion R of the main surface 1x including one protrusion portion 15b inside, the thickness of the passivation film 31 becomes continuously smaller away from the protrusion portion 15b. Such an area where the thickness of the passivation film 31 changes is an area within 10 μm to 15 μm away from a side surface 15y of the protrusion portion 15b, and outside of this area, the passivation film 31 has a substantially constant thickness.

In the area where the thickness of the passivation film 31 changes, an upper surface 31x of the passivation film 31 is inclined with respect to the main surface 1x.

Although the passivation film 31 is etched back to expose the upper surfaces 15x of the protrusion portions 15b in the step in FIG. 3D, the passivation film 31 may be polished by the CMP process, instead of being etched back, to expose the upper surfaces 15x.

When the CMP process is used, the passivation film 31 on the main surface 1x of the first semiconductor substrate 1 does not come into sliding contact with a polishing pad, and is therefore unlikely to decrease in thickness. Accordingly, the passivation film 31 may be left thicker on the main surface 1x than in the case of using the etch-back process. Thus, effective protection of the first semiconductor substrate 1 may be achieved by the passivation film 31.

Steps to be performed thereafter are described with reference to FIGS. 4A to 4H. FIGS. 4A to 4H are overall sectional views of the semiconductor device in the course of manufacturing thereof according to this embodiment.

Figure 4A:
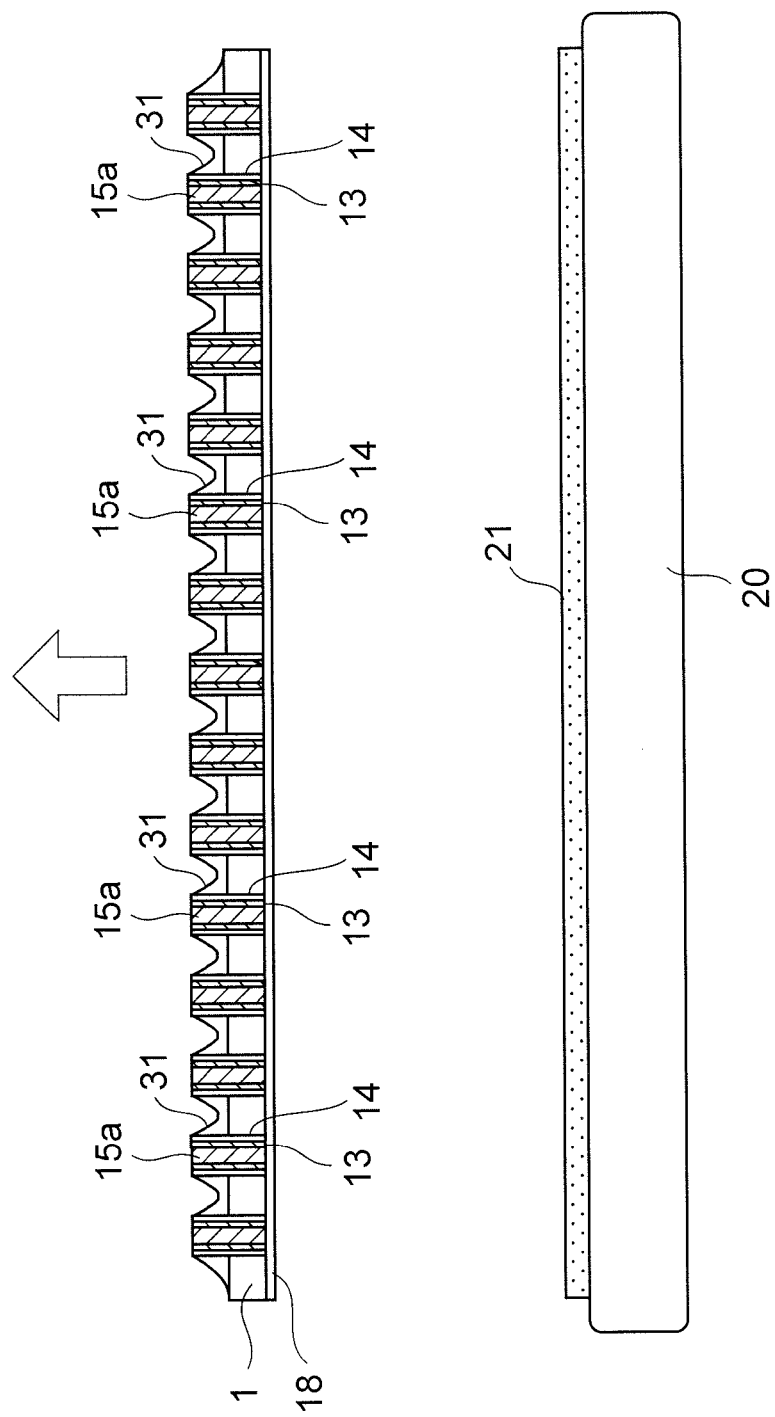

First, as illustrated in FIG. 4A, the first semiconductor substrate 1 is peeled off the supporting substrate 20. The peeling method is not particularly limited, but for example, the first semiconductor substrate 1 may be peeled off the supporting substrate 20 through dissolution of the adhesive 21 with a solvent or by laser irradiation to weaken the adhesiveness of the adhesive 21.

Next, as illustrated in FIG. 4B, the first semiconductor substrate 1 is diced into a plurality of first semiconductor elements 60.

Subsequently, as illustrated in FIG. 4C, a first circuit board 63 including a second semiconductor substrate 61, second electrodes 62, and third electrodes 66 is prepared. Such a circuit board made of silicon is also called a silicon interposer.

The second semiconductor substrate 61 is an example of the second semiconductor substrate.

Then, with the first circuit board 63 facing the first semiconductor substrate 1, the upper surfaces 15x of the first electrodes 15a are joined to the second electrodes 62 with solders 65 interposed therebetween. Thus, the first semiconductor element 60 is electrically and mechanically connected to the first circuit board 63.

Figure 4D:
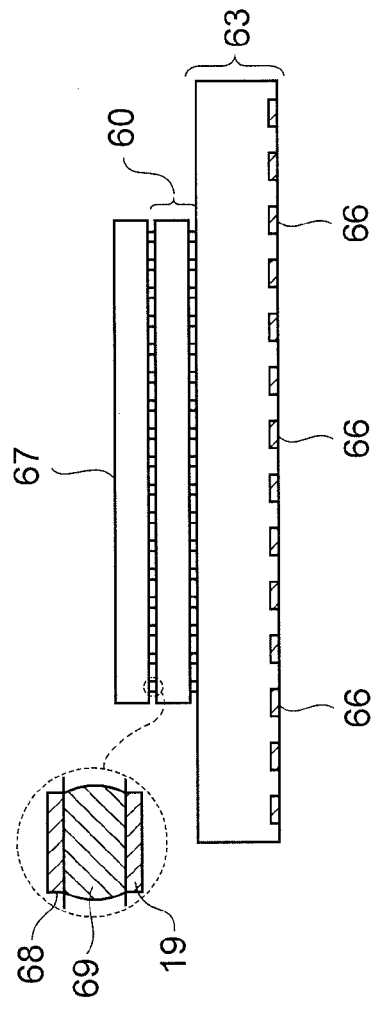

Next, as illustrated in FIG. 4D, a second semiconductor element 67 is prepared.

Thereafter, fourth electrodes 68 of the second semiconductor element 67 are joined to the copper wiring 19 of the first semiconductor element 60 with solder bumps 69 interposed therebetween. Thus, the first semiconductor element 60 is electrically and mechanically connected to the second semiconductor element 67.

Figure 4E:
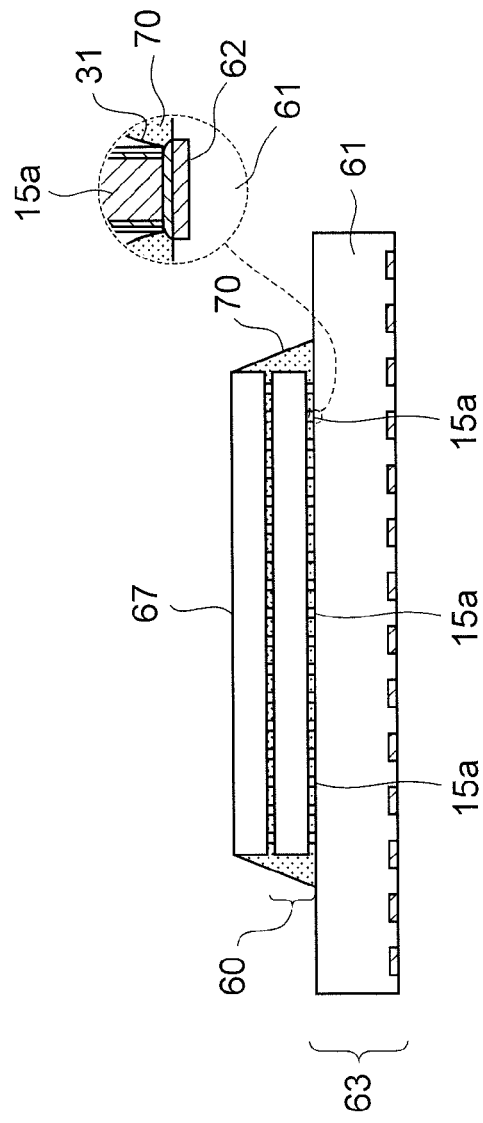

Next, as illustrated in FIG. 4E, a first underfill resin 70 is filled into a gap between the second semiconductor substrate 61 and the first semiconductor element 60. The first underfill resin 70 is an example of the second insulating film. A thermosetting resin, such as an epoxy resin, is used as the first underfill resin 70 in this embodiment.

Then, the first underfill resin 70 is heated to cure to thereby reinforce the connection strength between the second semiconductor substrate 61 and the first semiconductor element 60.

Since the space around each first electrode 15a is filled with the passivation film 31, there is no room for a void to be formed in the first underfill resin 70 around the first electrode 15a. Thus, the gap between the second semiconductor substrate 61 and the first semiconductor element 60 may be favorably filled with the first underfill resin 70, and at the same time, the first underfill resin 70 may be prevented from having a decreased reinforcing ability due to a void.

Note that the underfill resin. 70 is also filled into a gap between the first semiconductor element 60 and the second semiconductor element 67, thereby reinforcing the connection strength between the first semiconductor element 60 and the second semiconductor element 67.

Next, as illustrated in FIG. 4F, a circuit board 80 is prepared. Then, the third electrodes 66 of the second semiconductor substrate 61 are joined to fifth electrodes 81 of the circuit board 80 with solder bumps 82 interposed therebetween.

Next, as illustrated in FIG. 4G, as a second underfill resin 85, a thermosetting epoxy resin is filled into a gap between the second semiconductor substrate 61 and the circuit board 80, and is then thermally cured.

Figure 4H:
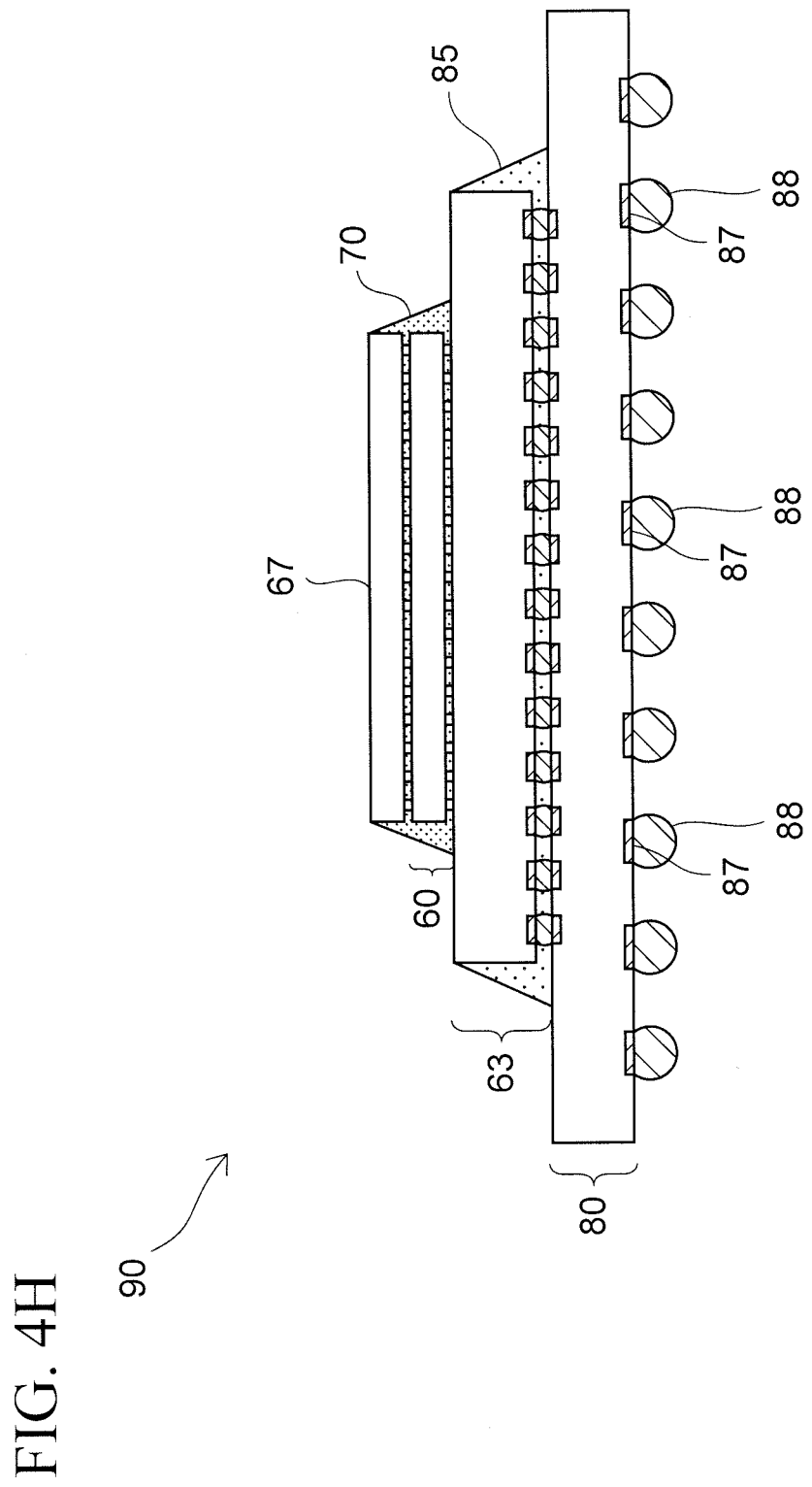

Thereafter, as illustrated in FIG. 4H, as external connection terminals 88, solder bumps are attached to sixth electrodes 87 of the circuit board 80. Thus, the basic structure of a semiconductor device 90 according to this embodiment is completed.

According to the embodiment described above, as illustrated in FIG. 3C, the thickness $t_2$ of the passivation film 31 on the upper surfaces 15x is made smaller than the thickness $t_1$ of the passivation film 31 on the main surface 1x, by use of a phenomenon in which an insulating material decreases in viscosity when, being heated.

Accordingly, the passivation film 31 may be left on the main surface 1x after the etch back process in FIG. 3D. For this reason, it may be unnecessary to form the sacrificial film 23 (see FIG. 2F) for the purpose of leaving the passivation film 31 on the main surface 1x, and the total number of steps for manufacturing the semiconductor devices may be reduced since the steps for forming and removing the sacrificial film may be omitted.

Further, according to this embodiment, the passivation film 31 is left thick at the base of each protrusion portion 15b. Accordingly, even when a mechanical impact is applied to the protrusion portion 15b during mounting or the like, the passivation film 31 buffers the damage received by the protrusion portion 15b.

Modification

In thermally curing the coating film 30 as illustrated in FIG. 7, the temperature rising rate for the coating film 30 in Step S2 may be set to a value different from, i.e., higher than, that in Step S3.

Thereby, the time period for which the coating film 30 is decreased to the second viscosity $V_2$ in Step S2 may be shortened, to prevent the surface tension of the coating film 30 from causing the coating film 30 to flow from the first area I to the second area II. Thus, the coating film 30 may be prevented from becoming not thick enough in the first area I.

Moreover, when formed by the coating method, the passivation film 31 has a lower Young's modulus and higher flexibility than that formed by the CVD process. Accordingly, even when an external force is applied to the first electrodes 15a, the passivation film 31 is unlikely to foe cracked and may maintain its moisture prevention ability.

In addition, the passivation film 31 is left thick at the base of each protrusion portion 15b in this modification, too. Accordingly, even when a mechanical impact is applied to the protrusion portion 15b during mounting or the like, the passivation film 31 buffers the damage received by the protrusion portion 15b.

Second Embodiment

In the first embodiment described above, the solvent in the coating film 30 is removed in advance in Step S1 in FIG. 7 to prevent the coating film 30 from flowing from the first area I to the second area II in Step S2 and becoming not thick enough in the first area I.

The method for preventing the flowing of the coating film 30 is not limited to this. Before Step S2, a step described below in any of first to third examples may be performed.

First Example

In this example, the curing process of the coating film 30 includes a step of increasing the viscosity of the coating film 30 through ultraviolet irradiation.

Figure 8:
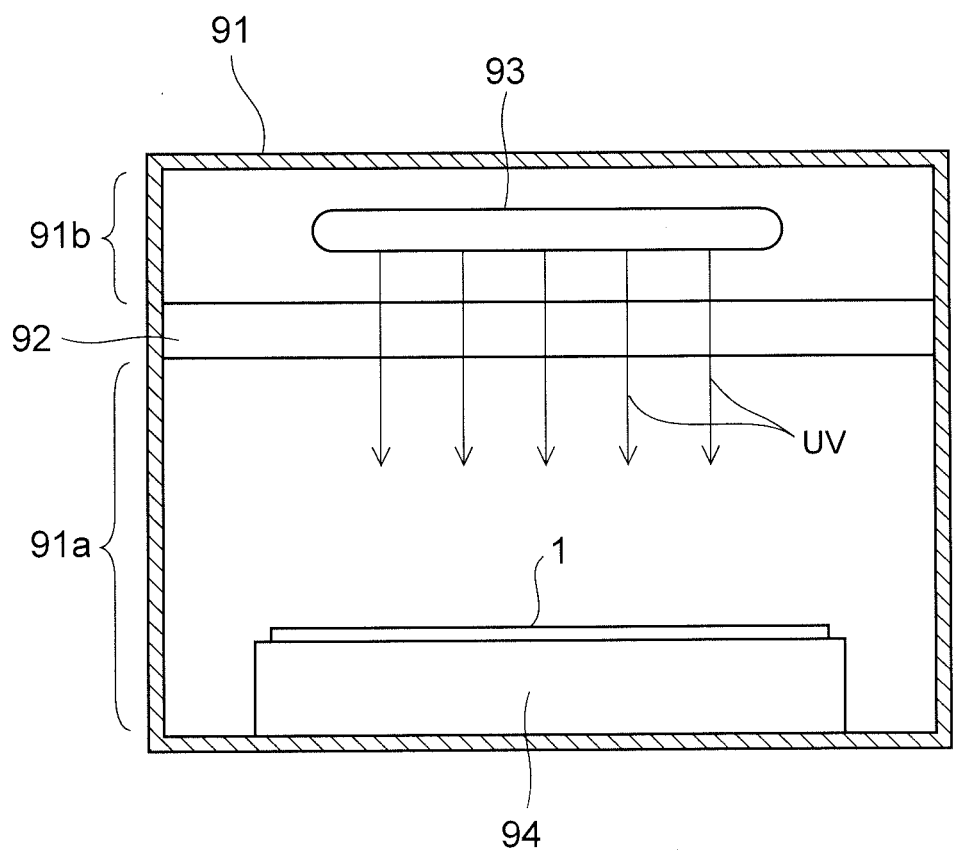
FIG. 8 is a sectional view of a chamber used in a first example of a second embodiment.

FIG. 8 is a sectional view of a chamber 91 used in this example.

In this chamber 91, the first semiconductor substrate 1 is heated and irradiated with ultraviolet rays. The chamber 91 has a transparent quartz plate 92 which divides the inside of the chamber 91 into a lower portion 91a and an upper portion 91b.

Among these portions, the lower portion 91a may be depressurized to a pressure of about 1 mm Torr to 500 Torr, and includes a heating plate 94 configured to heat the first semiconductor substrate 1 with a heater (not illustrated).

The upper portion 91b is provided with an ultraviolet lamp 93 configured to irradiate the first semiconductor substrate 1 with ultraviolet rays UV through the quartz plate 92.

Figure 9:
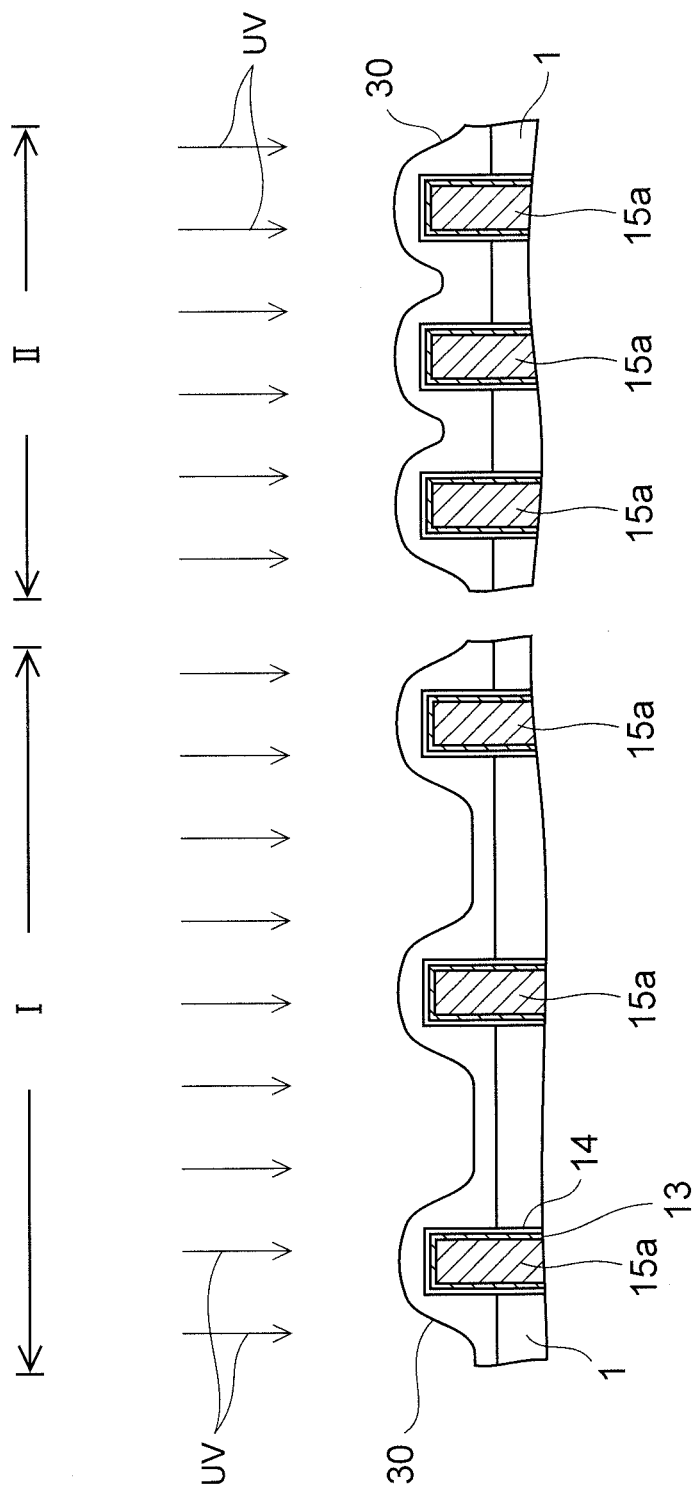
FIG. 9 is a sectional view of a semiconductor device in the course of manufacturing thereof according to the first example of the second embodiment.

FIG. 9 is a sectional view of a semiconductor device in the course of manufacturing thereof according to this example. Note that elements in FIG. 9 which are the same as those described in the first embodiment are denoted by the same reference numerals as those used in the first embodiment, and are not described again below.

In this example, after performing the steps in FIGS. 3A and 3B of the first embodiment, the coating film 30 is irradiated with the ultraviolet rays UV inside the chamber 91 as illustrated in FIG. 9, so as to cross-link the insulating component in the coating film 30 to increase the viscosity of the coating film 30.

By increasing the viscosity of the coating firm 30 before performing Step S2 in FIG. 7 in this way, the flowing of the coating film 30 in Step S2 may be prevented.

Further, by curing the coating film 30 in a depressurized atmosphere, the surface tension of the coating film 30 caused by the atmosphere may be reduced. Accordingly, the coating film 30 may be prevented from flowing, due to its surface tension, to the second area II having the densely-located first electrodes 15a, and becoming not thick enough in the first area I.

Further, Steps S2 and S3 may be performed by heating the first semiconductor substrate 1 with the heating plate 94 as soon as the irradiation with the ultraviolet rays UV is finished. Thus, all the steps may be performed in the same chamber 91.

As a result of these steps, the passivation film 31 is left thick at the base of each protrusion portion 15b. Accordingly, even when a mechanical impact is applied to the protrusion portion 15b during mounting or the like, the passivation film 31 buffers the damage received by the protrusion portion 15b.

Second Example

In this example, the curing process of the coating film 30 includes a step of increasing the viscosity of the coating film 30 through microwave irradiation.

Figure 10:
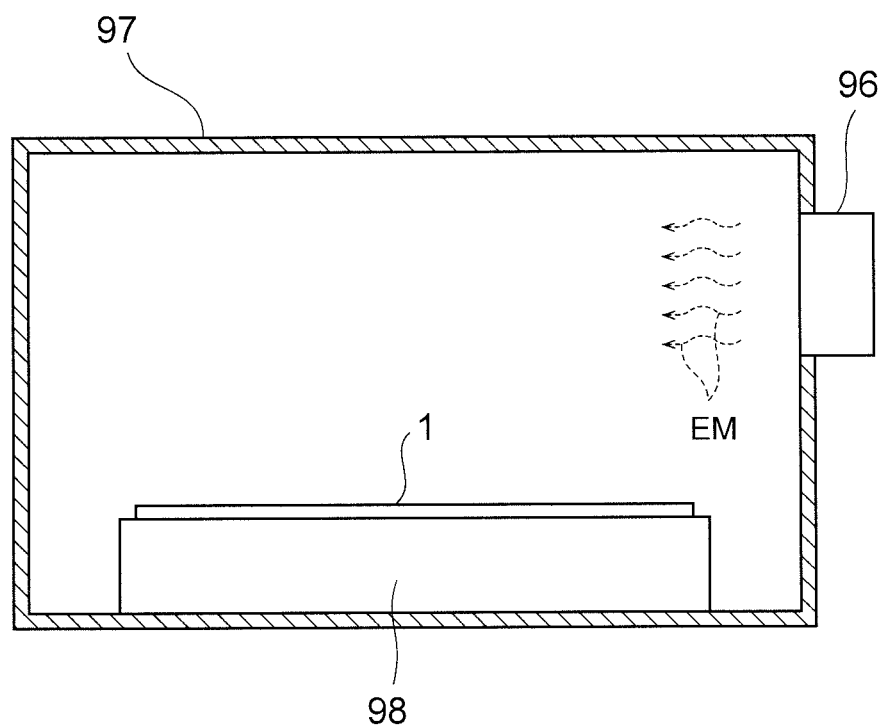
FIG. 10 is a sectional view of a chamber used in a second example of the second embodiment.

FIG. 10 is a sectional view of a chamber 97 used in this example.

This chamber 97 may be depressurized to a pressure of 1 mm Torr to 500 Torr, and has a heating plate 98 configured to heat the first semiconductor substrate 1 and a magnetron 96 configured to generate microwaves EM.

Figure 11:
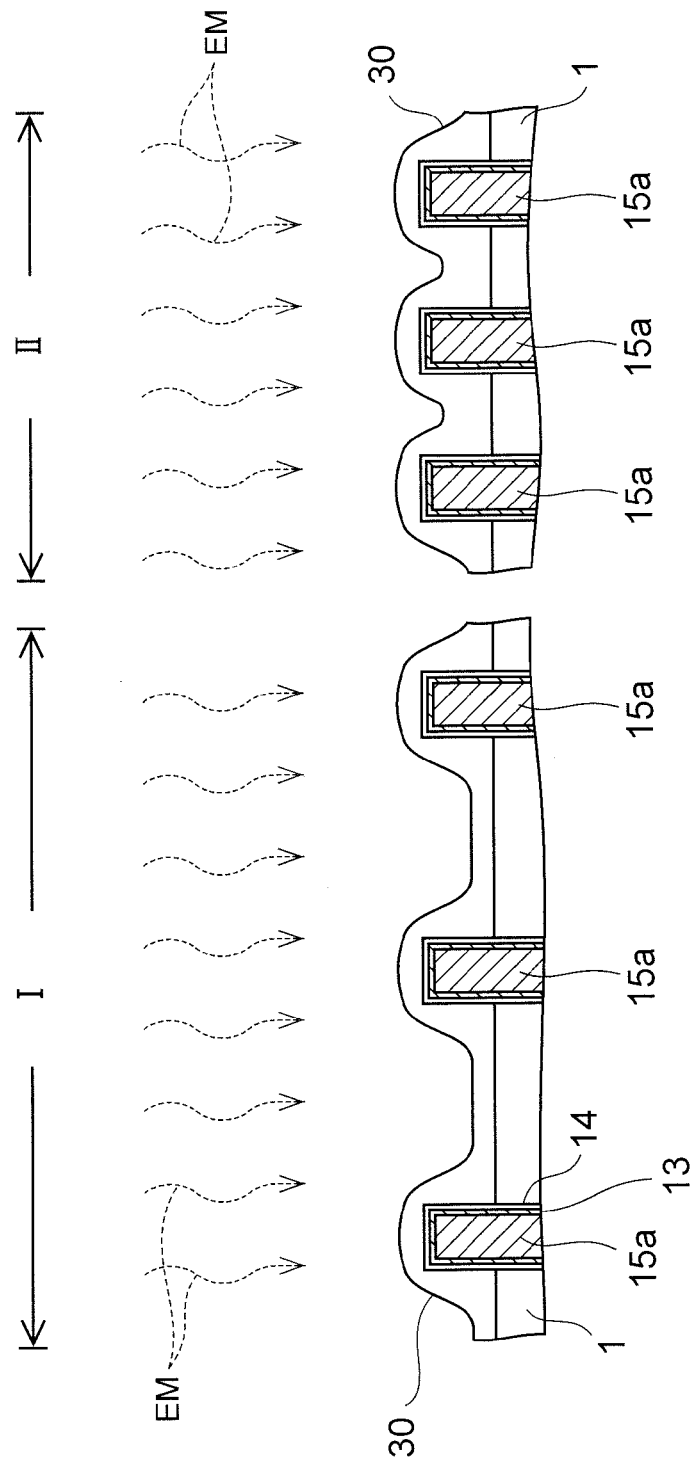
FIG. 11 is a sectional view of a semiconductor device in the course of manufacturing thereof according to the second example of the second embodiment.

FIG. 11 is a sectional view of a semiconductor device in the course of manufacturing thereof according to this example. Note that elements in FIG. 11 which are the same as those described in the first embodiment are denoted by the same reference numerals as those used in the first embodiment, and are not described again below.

In this example, after performing the steps in FIGS. 3A and 3B of the first embodiments the coating film 30 is irradiated with the microwaves EM inside the chamber 97 as illustrated in FIG. 10, so as to cross-link the insulating component in the coating film 30 to increase the viscosity of the coating film 30.

Thereby, as in the first example, the coating film 30 may be prevented from flowing from the first area I to the second area II in Step S2 to be performed thereafter. Further, for the same reason as that in the first example, by curing the coating film 30 in a depressurized atmosphere, the coating film 30 may be prevented from flowing, due to its surface tension, from the first area I to the second area II, and becoming not thick enough in the first area I.

As a result of these steps, the passivation film 31 is left thick at the base of each protrusion portion 15*b*. Accordingly, even when a mechanical impact is applied to the protrusion portion 15*b* during mounting or the like, the passivation film 31 buffers the damage received by the protrusion portion 15*b*.

Third Example

In this example, the curing process of the coating film 30 includes a step of increasing the viscosity of the coating film 30 through electron-beam irradiation.

Figure 12:
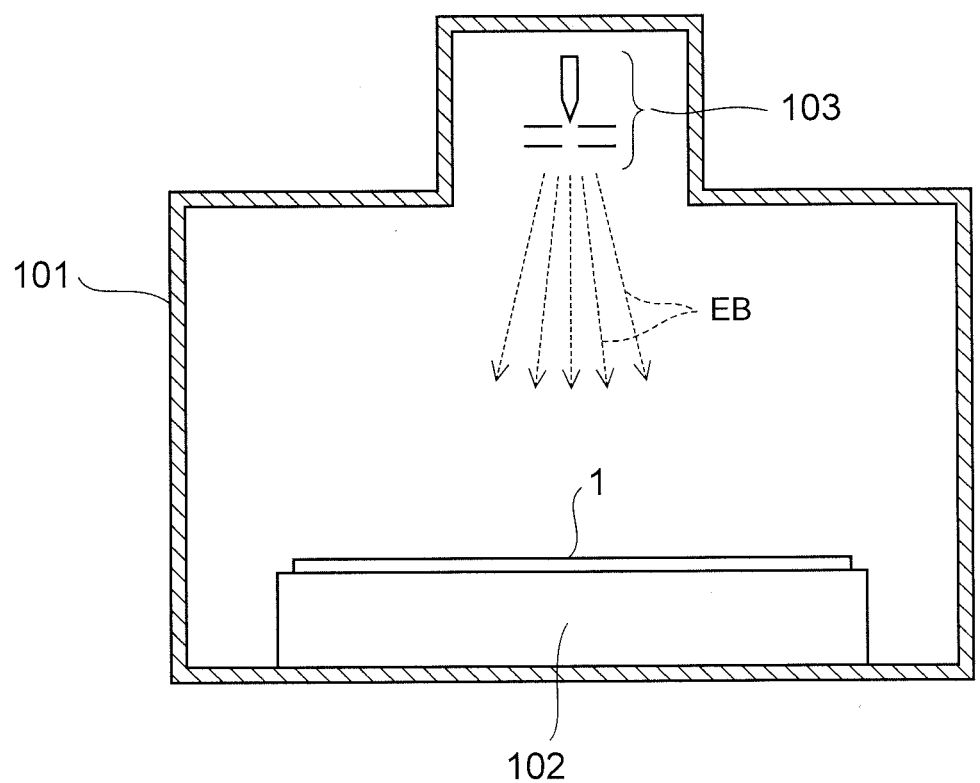
FIG. 12 is a sectional view of a chamber used in a third example of the second embodiment.

FIG. 12 is a sectional view of a chamber 101 used in this example.

This chamber 101 may be depressurized to a pressure of 1 mm Torr to 500 Torr, and has a heating plate 102 configured to heat the first semiconductor substrate 1 and an electron gun 103 configured to generate electron beams EB.

Figure 13:
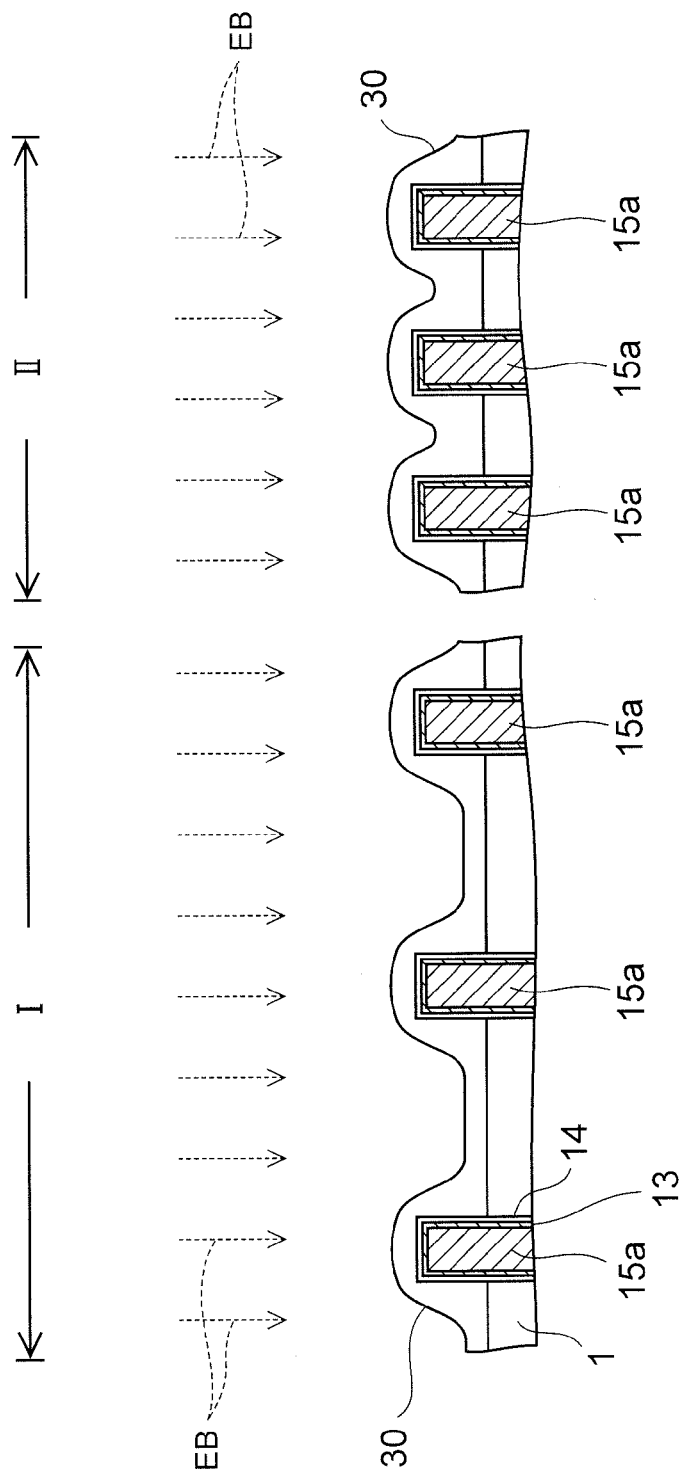
FIG. 13 is a sectional view of a semiconductor device in the course of manufacturing thereof according to the third example of the second embodiment.

FIG. 13 is a sectional view of a semiconductor device in the course of manufacturing thereof according to this example. Note that elements in FIG. 13 which are the same as those described in the first embodiment are denoted by the same reference numerals as those used in the first embodiment, and are not described again below.

In this example, after performing the steps in FIGS. 3A and 3B of the first embodiment, the coating film 30 is irradiated with the electron beams EB inside the chamber 101 as illustrated in FIG. 13, so as to cross-link the insulating component in the coating film 30 to increase the viscosity of the coating film 30.

Thereby, as in the first and second examples, the coating film 30 may be prevented from flowing from the first area I to the second area II in Step S2. Further, as in the first and second examples, by curing the coating film 30 in a depressurized atmosphere, the coating film 30 may be prevented from becoming not thick enough in the first area I.

As a result of these steps, the passivation film 31 is left thick at the base of each protrusion portion 15*b*. Accordingly, even when a mechanical impact is applied to the protrusion portion 15*b* during mounting or the like, the passivation film 31 buffers the damage received by the protrusion portion 15*b*.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
    forming a first electrode on a first semiconductor substrate, the first electrode including a first portion protruding from a main surface of the first semiconductor substrate;
    coating the main surface and the first electrode with an insulating material having a first viscosity at a first temperature, having a second viscosity lower than the first viscosity at a second temperature higher than the first temperature, and having a third viscosity higher than the second viscosity at a third temperature higher than the second temperature; and
    forming a first insulating film by curing the insulating material, wherein
    the forming the first insulating film includes:
        after the coating, bringing the insulating material having the first viscosity to the second viscosity by heating the insulating material under a first condition; and
        after the bringing the insulating material to the second viscosity, bringing the insulating material to the third viscosity by heating the insulating material under a second condition, and
        a temperature rising rate under the first condition for the first semiconductor substrate is different from a temperature rising rate under the second condition.

2. The method of manufacturing a semiconductor device according to claim 1, further comprising, before the bringing the insulating material to the second viscosity:
    bringing the first semiconductor substrate having the first temperature to a fourth temperature higher than the first temperature and lower than the second temperature by heating the first semiconductor substrate; and
    maintaining the first semiconductor substrate at the fourth temperature for a first period of time.

3. The method of manufacturing a semiconductor device according to claim 2, wherein
    the insulating material contains a solvent having a boiling point higher than the third temperature, and
    in the maintaining the first semiconductor substrate at the fourth temperature, the solvent is removed from the insulating material.

4. The method of manufacturing a semiconductor device according to claim 1, further comprising, before the bringing the insulating material to the second viscosity:
    curing the insulating material in a depressurized atmosphere.

5. The method of manufacturing a semiconductor device according to claim 4, wherein
    the curing the insulating material is performed by irradiating the insulating material with any of ultraviolet rays, microwaves, and electron beams.

6. The method of manufacturing a semiconductor device according to claim 1, wherein
    the insulating material contains an insulation component which is caused to undergo a cross-linking reaction by any of heating, ultraviolet irradiation, microwave irradiation, and electron-beam irradiation.

7. The method of manufacturing a semiconductor device according to claim 6, wherein
    the insulating material is any of divinylsiloxane bisbenzocyclobutene, a benzocyclobutene polymer, polyimide, fluorinated polyimide, hydrogen silsesquioxane, polysilsesquioxane, polymethylsilsesquioxane, an amorphous fluorinated polymer, organosiloxane, and an epoxy resin.

8. The method of manufacturing a semiconductor device according to claim 1, further comprising, after the forming the first insulating film:
    exposing an upper surface of the first portion of the first electrode by removing a portion of the first insulating film; and
    after the exposing, making the first semiconductor substrate face a second semiconductor substrate including a second electrode, and joining the upper surface of the first portion of the first electrode to the second electrode.

9. The method of manufacturing a semiconductor device according to claim 8, wherein
after the joining, a second insulating film is formed between the first semiconductor substrate and the second semiconductor substrate.

* * * * *